United States Patent
Shevelow et al.

(10) Patent No.: US 11,761,843 B2
(45) Date of Patent: *Sep. 19, 2023

(54) FLAT FLEXIBLE CONDUCTIVE FLUID SENSOR CABLE AND CONNECTOR

(71) Applicant: Pica Product Development, LLC, Derry, NH (US)

(72) Inventors: Richard Shevelow, Estero, FL (US); Scott Stapleford, Londonderry, NH (US); Patrick Walsh, Allenstown, NH (US); Mark W. Pare, Derry, NH (US)

(73) Assignee: PICA Product Development, LLC, Derry, NH (US)

( * ) Notice: Subject to any disclaimer, the term of this patent is extended or adjusted under 35 U.S.C. 154(b) by 345 days.

This patent is subject to a terminal disclaimer.

(21) Appl. No.: 17/128,778

(22) Filed: Apr. 12, 2021

(65) Prior Publication Data
US 2021/0310892 A1 Oct. 7, 2021

Related U.S. Application Data

(63) Continuation of application No. PCT/US2020/037657, filed on Jun. 14, 2020, which
(Continued)

(51) Int. Cl.
*G01M 3/16* (2006.01)
*H01B 5/14* (2006.01)
(Continued)

(52) U.S. Cl.
CPC ............. *G01M 3/165* (2013.01); *H01B 5/14* (2013.01); *H01R 12/616* (2013.01)

(58) Field of Classification Search
CPC ....... G01M 3/165; H01B 5/14; H01R 12/616; H01R 12/592; H01R 12/67; H05K 3/28;
(Continued)

(56) References Cited

U.S. PATENT DOCUMENTS 3,395,381 A 7/1968 Huffnagle
3,612,744 A 10/1971 Thomas
(Continued)

FOREIGN PATENT DOCUMENTS

CN 203277846 U 11/2013
CN 204313883 U 5/2015
(Continued)

OTHER PUBLICATIONS

PCT International Search Report and Written Opinion of the International Searching Authority for International Application No. PCT/US2020/037657, dated Sep. 4, 2020.

*Primary Examiner* — Herbert K Roberts
*Assistant Examiner* — Anthony W Megna Fuentes

(57) ABSTRACT

Described embodiments provide a flat conductive fluid sensor cable capable of manufacture in long lengths comprising a flexible substrate, two or more flat conductors, and a fluid-permeable cover material arranged to allow a conductive fluid to form an electrically conductive path between the two or more conductors when conductive fluid contacts the conductive fluid sensor cable.

27 Claims, 20 Drawing Sheets

Related U.S. Application Data is a continuation-in-part of application No. 16/516,077, filed on Jul. 18, 2019, now Pat. No. 10,900,859.

(60) Provisional application No. 63/021,629, filed on May 7, 2020, provisional application No. 62/892,005, filed on Aug. 27, 2019, provisional application No. 62/862,005, filed on Jun. 14, 2019.

(51) Int. Cl.
*H01R 12/61* (2011.01)
*H01R 12/59* (2011.01)
*H01R 12/67* (2011.01)
*H05K 3/28* (2006.01)
*H02G 1/14* (2006.01)
*H05K 3/38* (2006.01)

(58) Field of Classification Search
CPC . H05K 3/386; H05K 2201/09236; H02G 1/14
See application file for complete search history.

(56) References Cited

U.S. PATENT DOCUMENTS

| | | |
|---|---|---|
| 3,939,558 A * | 2/1976 | Riley ............... H05K 3/281 264/272.17 |
| 4,082,402 A | 4/1978 | Kinkaid et al. |
| 4,124,265 A | 11/1978 | Turk |
| 4,374,379 A | 2/1983 | Dennison, Jr. |
| 4,843,305 A | 6/1989 | Akiba |
| 4,859,204 A | 8/1989 | Daly |
| 4,900,268 A | 2/1990 | Kunishi |
| 6,089,904 A | 7/2000 | Wu |
| 6,175,310 B1 | 1/2001 | Gott |
| 6,443,758 B2 | 9/2002 | Nagai |
| 6,505,509 B2 | 1/2003 | Gualtieri |
| 6,526,807 B1 | 3/2003 | Doumit et al. |
| 7,292,155 B2 | 11/2007 | Vokey et al. |
| 7,295,126 B2 | 11/2007 | Stackelhouse |
| 7,338,310 B2 | 3/2008 | Kumakura |
| 8,262,250 B2 | 9/2012 | Li et al. |
| 8,714,772 B1 | 5/2014 | Levante et al. |
| 8,872,032 B2 | 10/2014 | Lin et al. |
| 9,910,003 B1 * | 3/2018 | Lastinger ............... G01N 25/56 |
| 2001/0035048 A1 | 11/2001 | Gualtieri |
| 2006/0286848 A1 | 12/2006 | Kumakura |
| 2013/0069675 A1 | 3/2013 | Woloszyk |
| 2017/0003192 A1 | 1/2017 | Ling et al. |

FOREIGN PATENT DOCUMENTS

| | | |
|---|---|---|
| CN | 206504834 U | 9/2017 |
| CN | 207069116 U | 3/2018 |
| CN | 207303424 U | 5/2018 |
| EP | 1524726 A1 | 4/2005 |
| EP | 1533871 A2 | 5/2005 |
| JP | 7-23514 A | 6/1993 |
| JP | H09115573 A | 5/1997 |
| JP | 109293571 A | 11/1997 |
| JP | 4090060 B2 | 5/2008 |
| JP | 4098290 B2 | 6/2008 |
| KR | 100424843 B1 | 3/2004 |
| KR | 20100138523 A | 12/2010 |

* cited by examiner

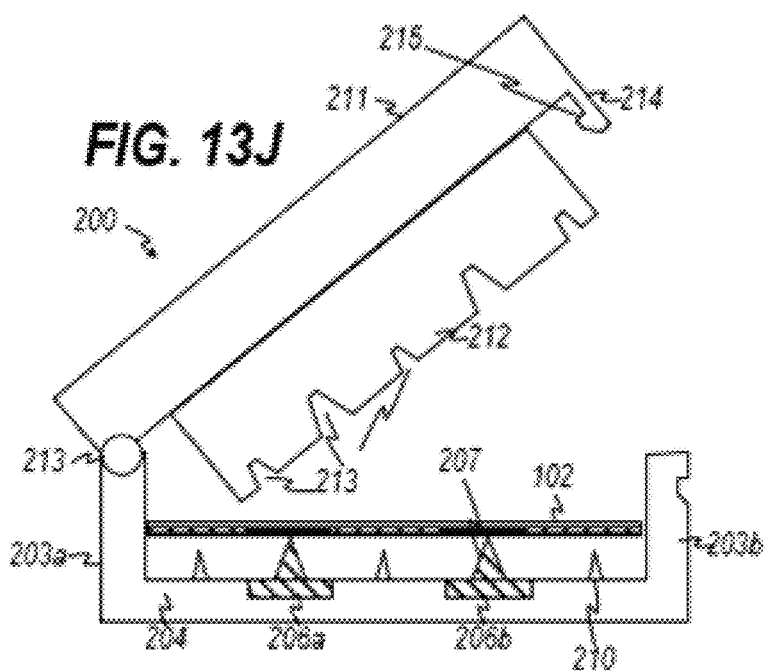
FIG. 13J
FIG. 13K
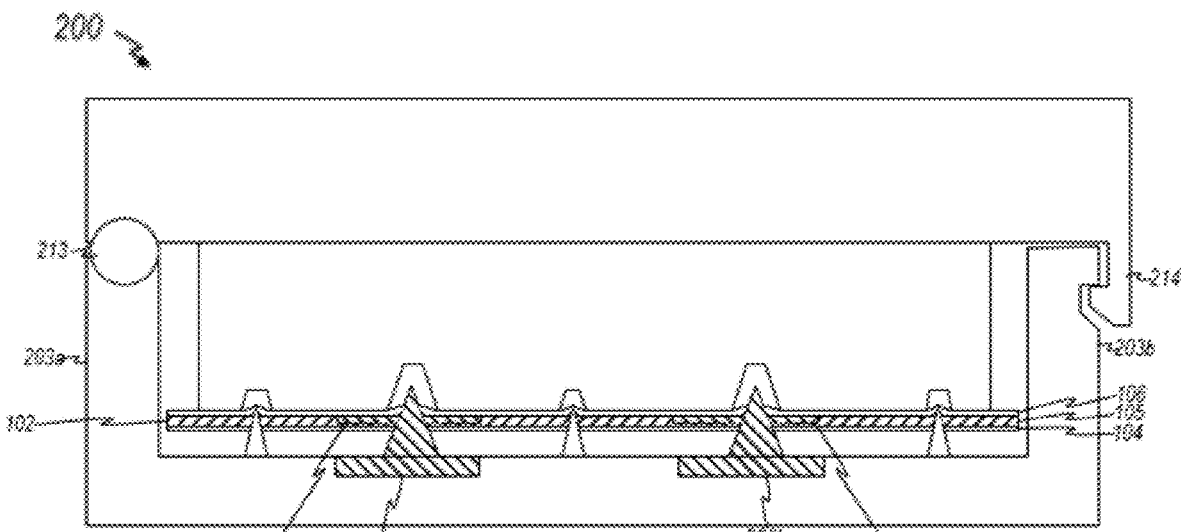
FIG. 13L

FLAT FLEXIBLE CONDUCTIVE FLUID SENSOR CABLE AND CONNECTOR

CROSS-REFERENCE TO RELATED APPLICATIONS

This application is a continuation, and claims the benefit of the filing date, of PCT/US20/37657 filed Jun. 14, 2020, which claims the benefit of U.S. provisional application nos. 62/862,005 filed on Jun. 14, 2019, and 63/021,629 filed on May 7, 2020, and this application is a continuation-in-part, and claims the benefit of the filing date, of U.S. patent application Ser. No. 16/516,077 filed on Jul. 18, 2019, the teachings of all of which are incorporated herein by reference in their entireties.

BACKGROUND

Water and other fluid leaks can cause significant damage to property and electronics if not detected and remediated in a timely manner. Various moisture and fluid sensors are available on the market, and generally include a pair of electrical probes that conduct current when both probes contact a continuous body of conducting fluid, such as undistilled water (e.g., water with dissolved salts and other ionic compounds, which is typical in tap water). The probes are connected to a conductive fluid sensor which drives a notification system such as an audio or visual indicator that indicates the presence or absence of conductive fluid across the probes. The notification system may also generate signal(s) that drive other equipment. For example, the notification system may drive a relay which turns off a water supply and/or turns on a pump when conductive fluid is detected.

Some conductive fluid sensors extend the sensing probes using a length of cable that includes individual moisture sensors at various points along the cable. These cables are expensive to manufacture and typically must be terminated in a cable-side connector or stiffened termination on each end of the cable, and thus are generally available only in fixed predetermined lengths. An improved cable and connector for use with a conductive fluid sensing system for detecting conductive fluid leaks is desired.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a fluid sensing system configured to detect the presence of a fluid. The system includes a flat flexible cable (FFC) coupled to a sensor. The FFC includes a substrate having a B-stage adhesive surface extending in an extension direction. First and second uninsulated flat conductors of the FFC are each laterally positioned and each extend in the extension direction. Each of the conductors are electrically isolated from one another in the absence of conductive fluid, and are laminated directly to the substrate solely by way of the B-stage adhesive surface. A fluid-permeable cover layer of the FFC is laminated directly to the substrate solely by way of the B-stage adhesive surface, and overlays and directly contacts the conductors, thereby sealing the conductors in fixed position between the substrate and the fluid-permeable cover layer. A conductive path between the first and second uninsulated flat conductors is only formed in the presence of a conductive fluid. The sensor includes a processor configured to generate a fluid detection signal in response to the conductive path being formed, which is transmitted to one or more remote devices.

BRIEF DESCRIPTION OF THE DRAWING FIGURES

Aspects, features, and advantages of the concepts, systems, circuits and techniques described herein will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features. Furthermore, the drawings are not necessarily to scale, emphasis instead being placed on the concepts disclosed herein.

Figure 2A:
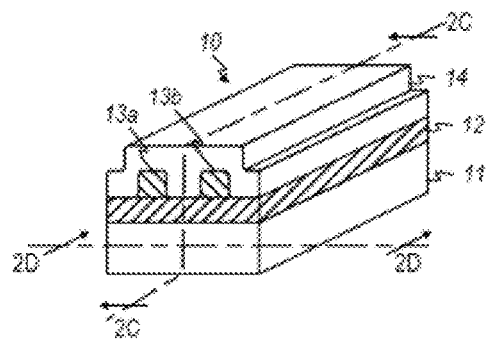
FIG. 2A is a perspective view of a portion of a cable implemented in accordance with a described embodiment.
Figure 2B:
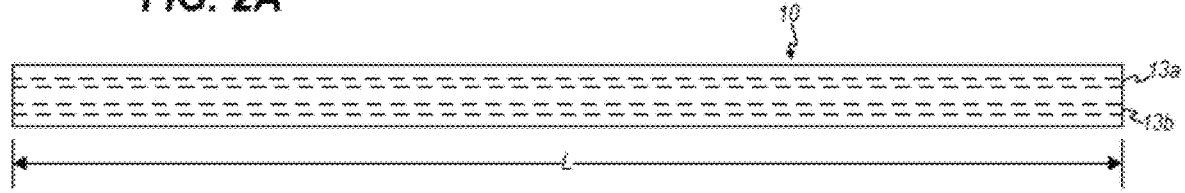
FIG. 2B is a plan view of a cable implemented in accordance with the cable shown in FIG. 2A.
Figure 2C:
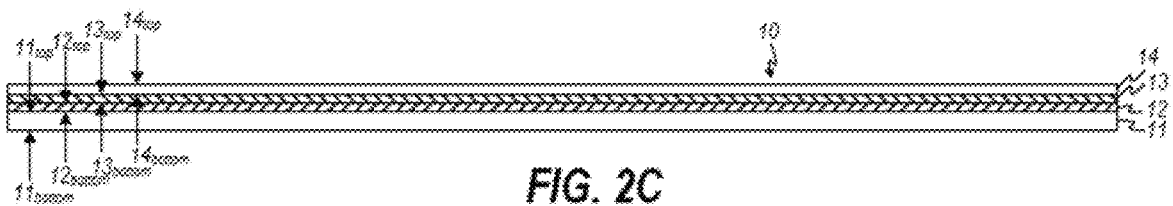
FIG. 2C is a cross-sectional view of the cable shown in FIG. 2A along the line 2C-2C looking in the direction of the arrows.
Figure 2D:
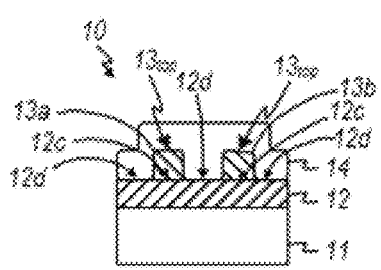
FIG. 2D is a cross-sectional view of the cable shown in FIG. 2A along the line 2D-2D looking in the direction of the arrows.
Figure 3A:
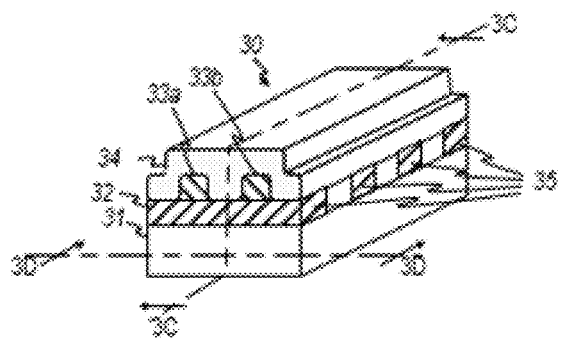
FIG. 3A is a perspective view of a portion of a cable implemented in accordance with a described embodiment.
Figure 3B:
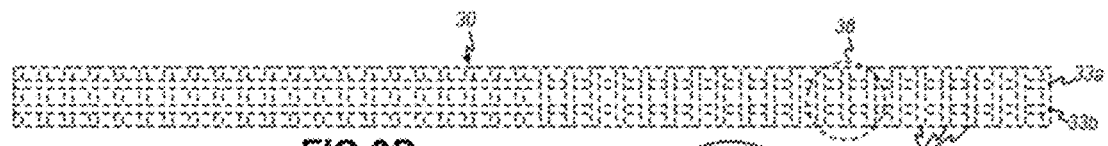
FIG. 3B is a plan view of the cable shown in FIG. 3A.
Figure 3C:
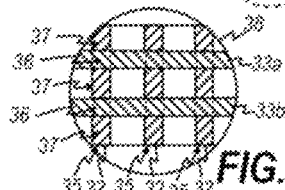
Figure 3C:
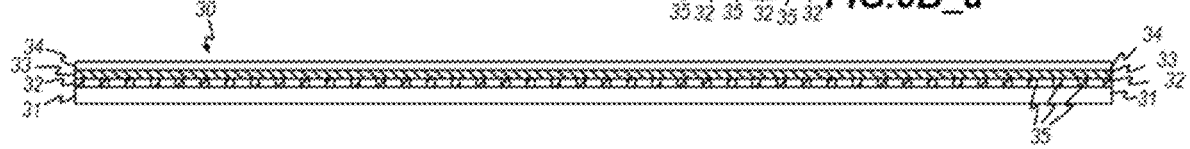
Figure 3D:
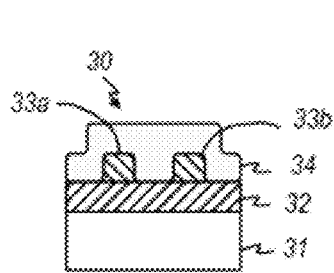
Figure 3E:
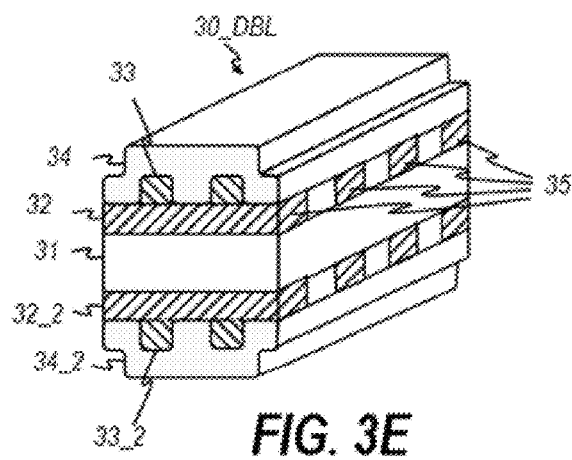
Figure 4A:
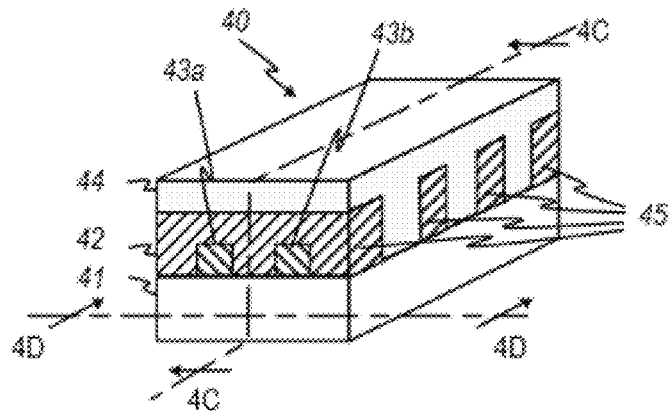
Figure 4B:
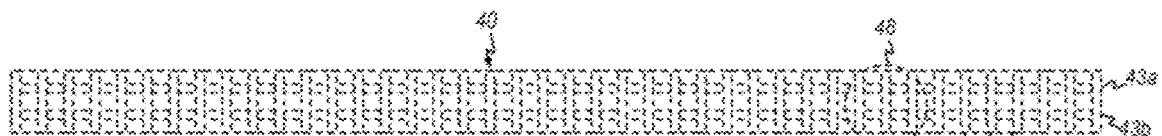
Figure 4C:
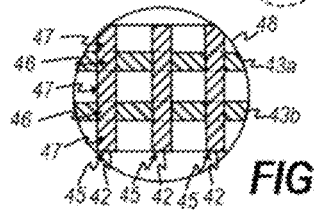
Figure 4C:
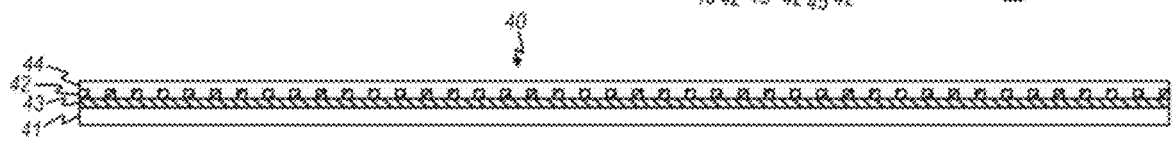
Figure 4D:
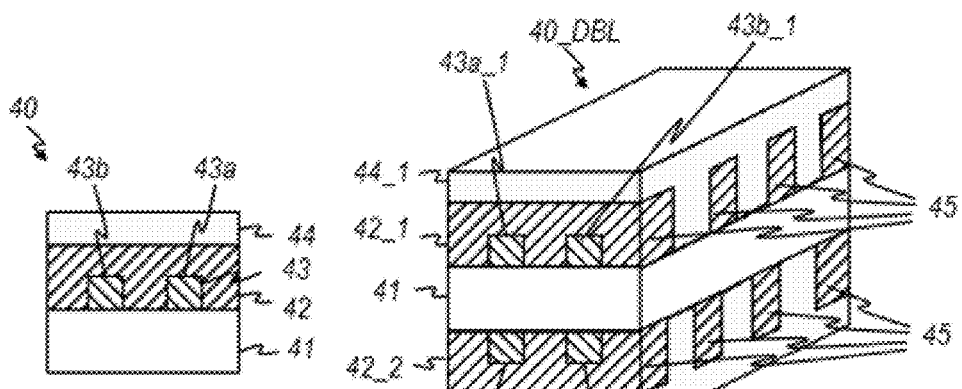
Figure 4E:
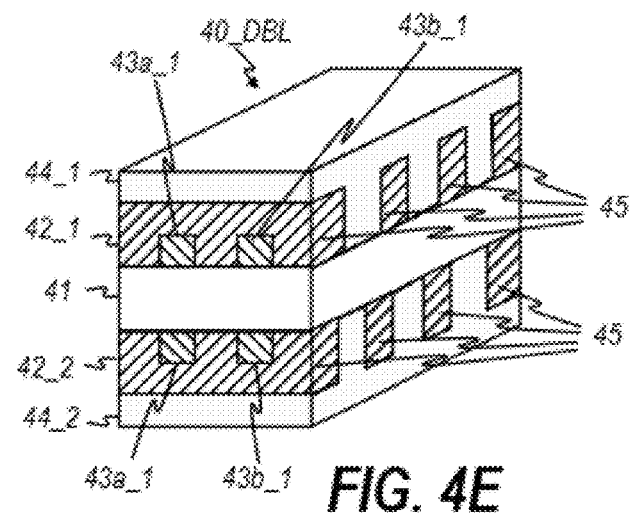
Figure 5A:
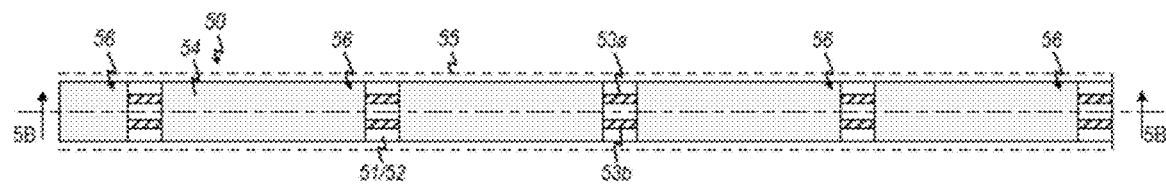
Figure 5B:
Figure 6A:
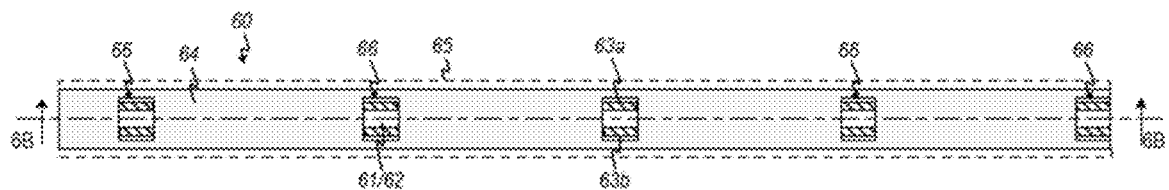
Figure 6B:
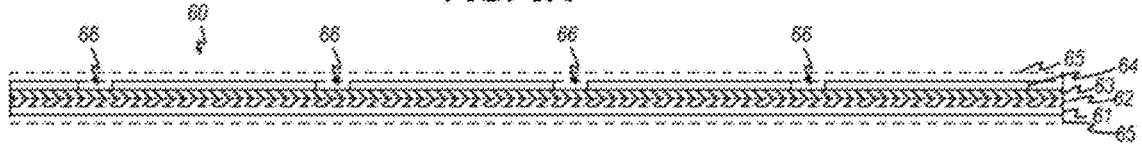
Figure 7A:
Figure 7B:
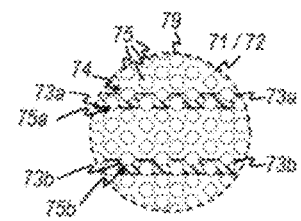
Figure 7C:
Figure 8A:
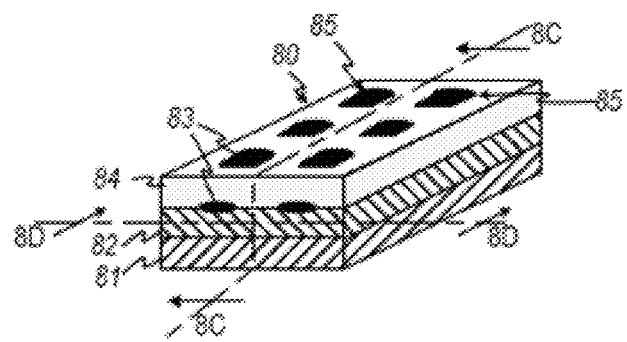
Figure 8B:
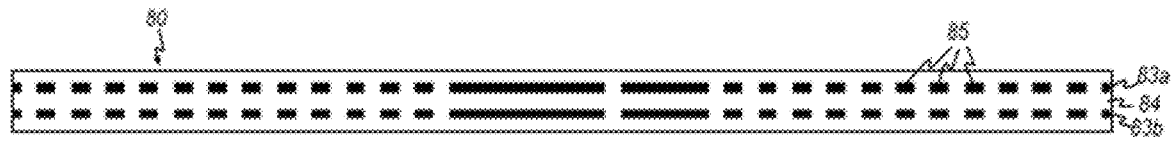
Figure 8C:
Figure 8D:
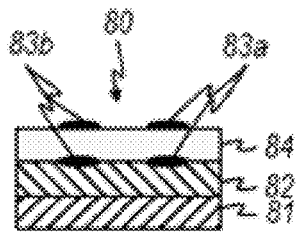
Figure 8E:
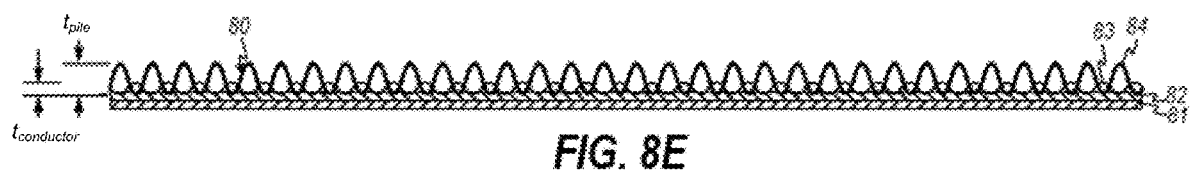
Figure 9A:
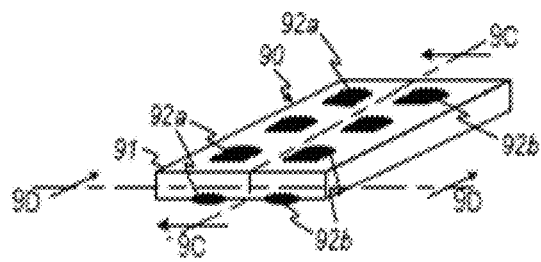
Figure 9B:
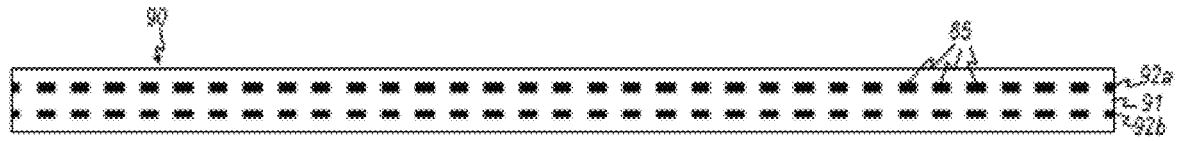
Figure 9C:
Figure 9D:
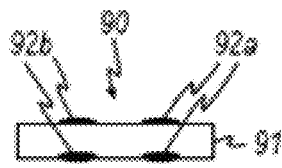
Figure 9E:
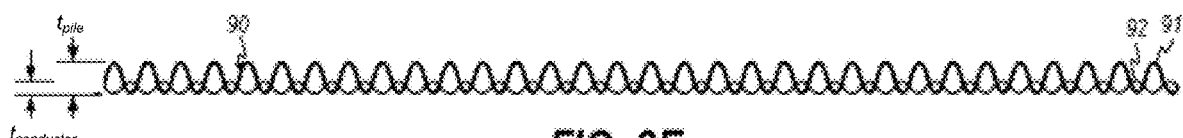
Figure 10:
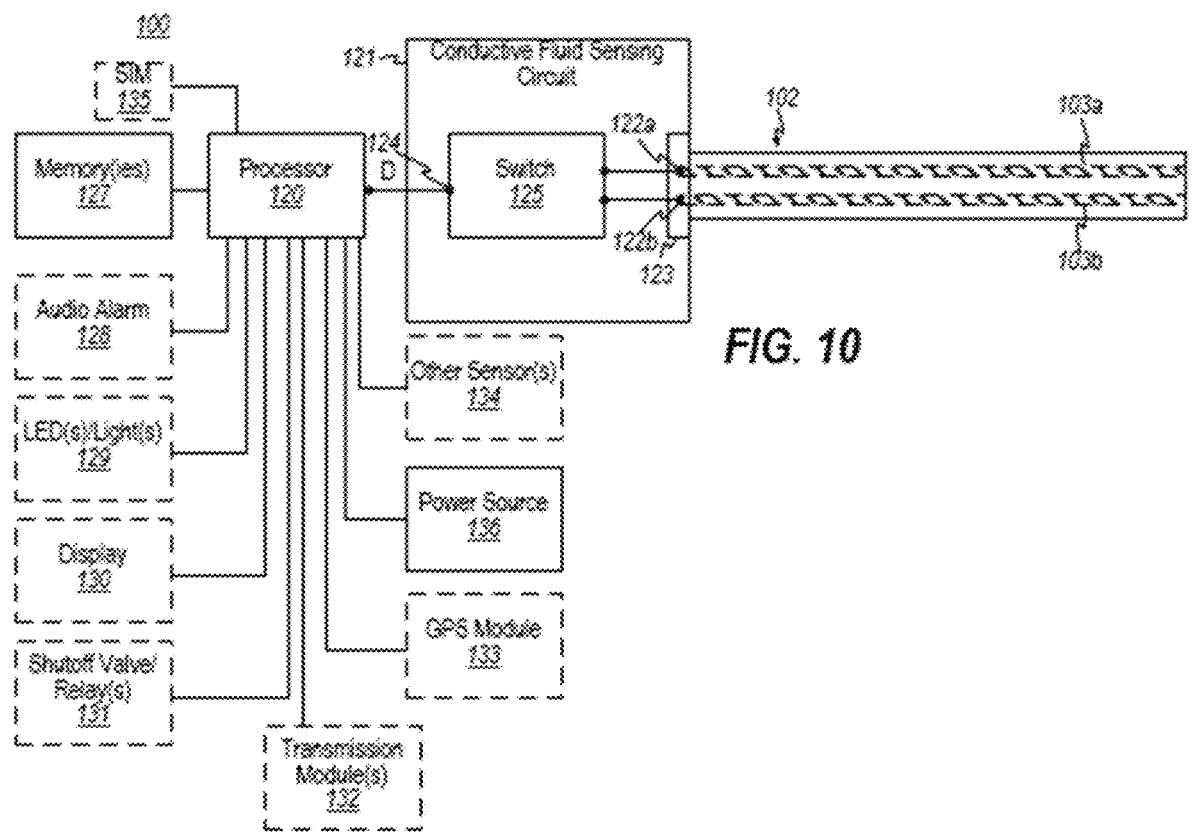
Figure 11:
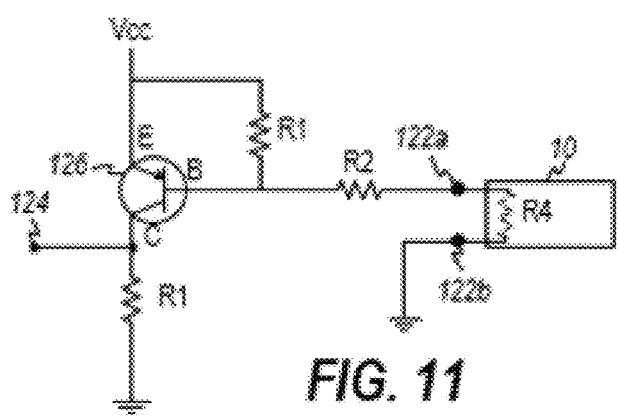
Figure 12A:
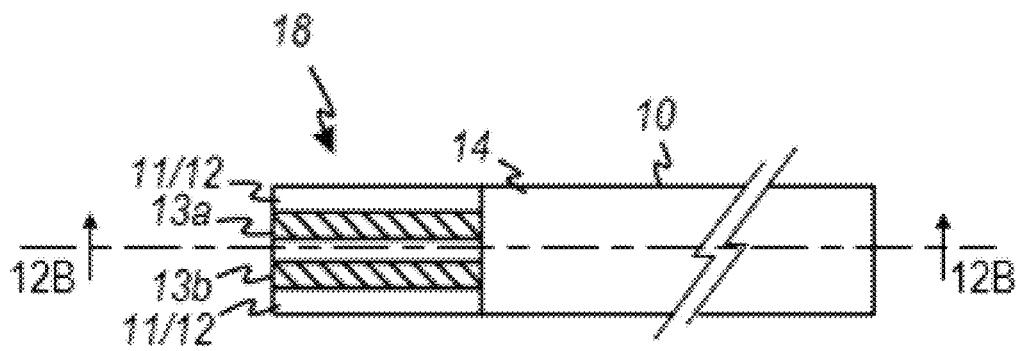
Figure 12B:
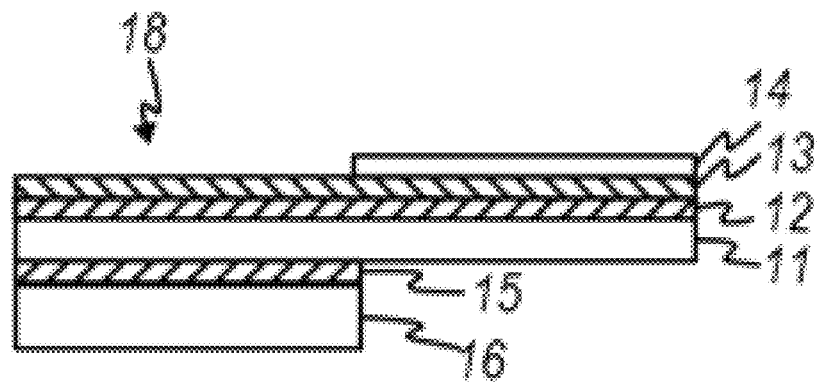
Figure 14:
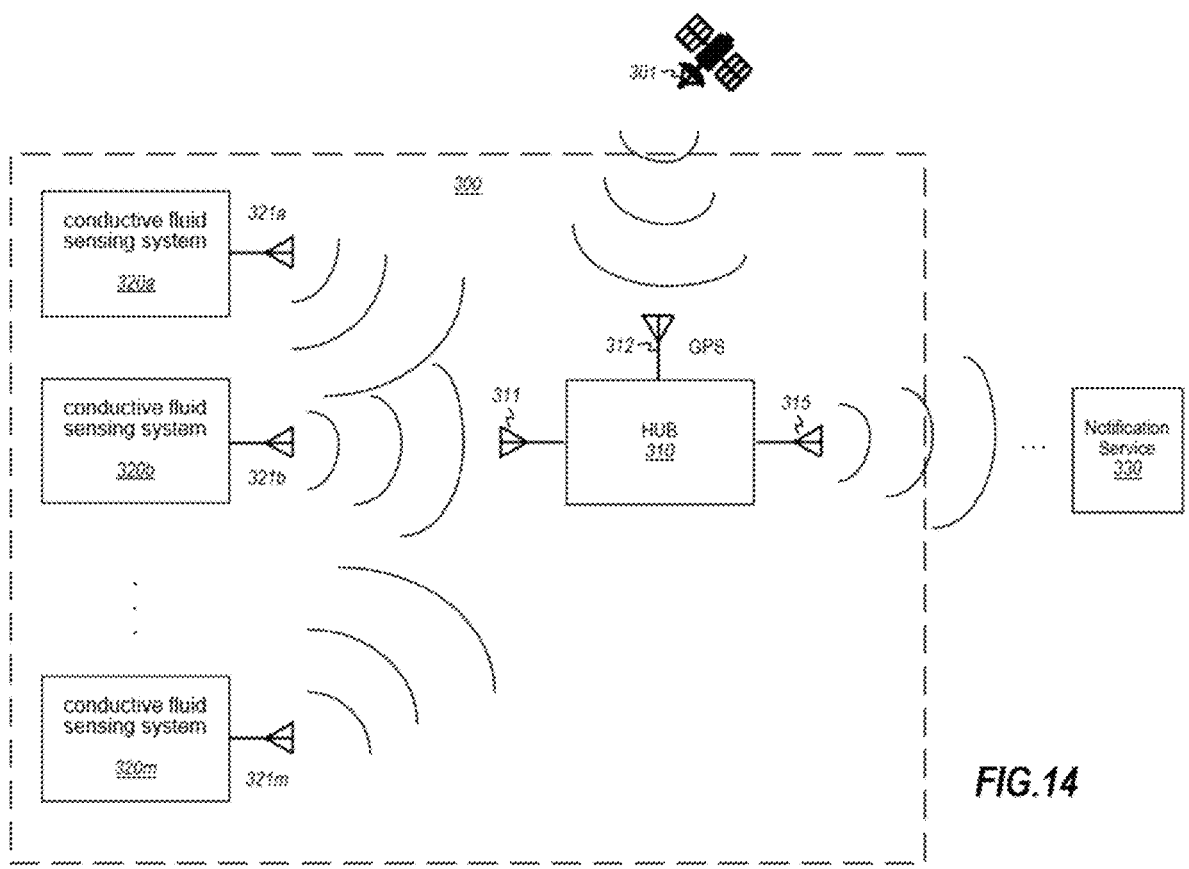
Figure 15A:
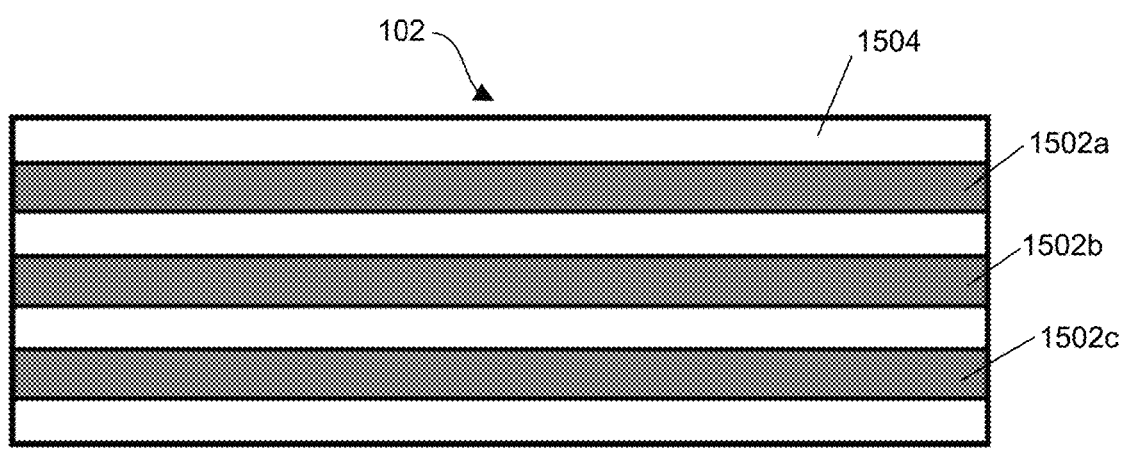
Figure 15B:
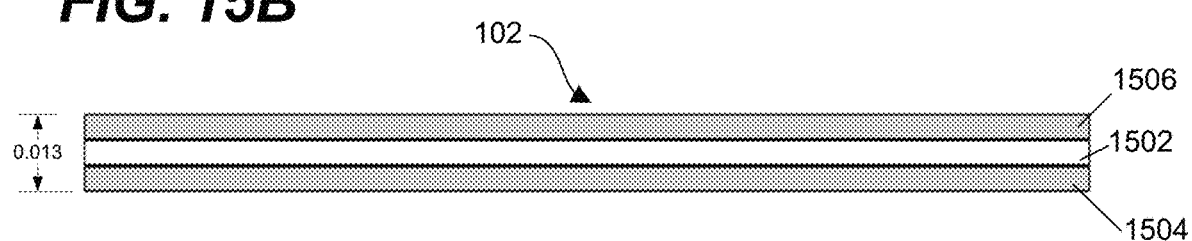

FIG. 3B_a is an enlarged plan view of a portion of the cable of FIG. 3B;

FIG. 3C is a cross-sectional view of the cable shown in FIG. 3A along the line 3C-3C looking in the direction of the arrows;

FIG. 3D is a cross-sectional view of the cable shown in FIG. 3A along the line 3D-3D looking in the direction of the arrows;

FIG. 3E is a perspective view of a portion of a double-sided version of the cable shown in FIG. 3A;

FIG. 4A is a perspective view of a portion of a cable implemented in accordance with a described embodiment;

FIG. 4B is a plan view of the cable shown in FIG. 4A;

FIG. 4B_a is an enlarged plan view of a portion of the cable of FIG. 4B;

FIG. 4C is a cross-sectional view of the cable of FIG. 4A along the line 4C-4C looking in the direction of the arrows;

FIG. 4D is a cross-sectional view of the cable of FIG. 4A along the line 4D-4D looking in the direction of the arrows;

FIG. 4E is a perspective view of a portion of a double-sided version of the cable of FIG. 4A;

FIG. 5A is an orthogonal view looking at the top of a cable implemented in accordance with a described embodiment;

FIG. 5B is a cross-sectional view of the cable of FIG. 5A along the line 5B-5B looking in the direction of the arrows;

FIG. 6A is an orthogonal view looking at the top of a cable implemented in accordance with a described embodiment;

FIG. 6B is a cross-sectional view of the cable of FIG. 6A along the line 6B-6B looking in the direction of the arrows;

FIG. 7A is an orthogonal view looking at the top of a cable implemented in accordance with a described embodiment;

FIG. 7B is an enlarged view of a portion of the cable of FIG. 7A;

FIG. 7C is a cross-sectional view of the cable shown in FIG. 7A along the line 7C-7C looking in the direction of the arrows;

FIG. 8A is a perspective view of a portion of a cable implemented in accordance with a described embodiment;

FIG. 8B is an orthogonal view looking at the top of the cable of FIG. 8A;

FIG. 8C is a cross-sectional view of the cable of FIG. 8A along the line 8C-8C looking in the direction of the arrows;

FIG. 8D is a cross-sectional view of the cable of FIG. 8A along the line 8D-8D looking in the direction of the arrows;

FIG. 8E is a cross-sectional view of the cable of FIG. 8A along the line 8C-8C looking in the direction of the arrows, showing different pile thickness than in FIG. 8C;

FIG. 9A is a perspective view of a portion of a cable implemented in accordance with a described embodiment;

FIG. 9B is an orthogonal view looking at the top of the cable of FIG. 9A;

FIG. 9C is a cross-sectional view of the cable of FIG. 9A along the line 9C-9C looking in the direction of the arrows;

FIG. 9D is a cross-sectional view of the cable of FIG. 9A along the line 9D-9D looking in the direction of the arrows;

FIG. 9E is a cross-sectional view of the cable of FIG. 9A along the line 9C-9C looking in the direction of the arrows, showing different pile thickness than in FIG. 9C;

FIG. 10 is a block diagram of a conductive fluid sensing system in accordance with described embodiments;

FIG. 11 is a schematic diagram of a conductive fluid sensing switch circuit in accordance with described embodiments;

FIG. 12A is an orthogonal view looking at the cover face of the first embodiment cable of FIG. 2A, illustrating an embodiment of a terminating end for the cable;

FIG. 12B is a cross-sectional view of the terminating end of the first embodiment cable of FIG. 2A along the line 2C-2C looking in the direction of the arrows;

FIGS. 13A-13L depict an example connector for receiving a cable implemented in accordance with described embodiments;

FIG. 14 is a system diagram illustrating an embodiment of a conductive fluid sensing and notification system in accordance with described embodiments;

FIGS. 15A and 15B are top and side views of a flat flexible cable having three conductors, in accordance with described embodiments;

FIGS. 16A-16D are isometric, top, side, and front views of a flat flexible cable and connector assemblies, in accordance with described embodiments;

FIGS. 17A-17F are isometric, top, bottom, left, right, and front views of a flat cable crimp connector assembly in an open configuration, in accordance with described embodiments;

FIGS. 18A-18F are isometric, top, bottom, left, right, and front views of a flat cable crimp connector assembly in a closed configuration, in accordance with described embodiments; and FIGS. 19A-19E are isometric, top, right, left, and front views of a connector pin and cable barb assembly of the flat cable crimp connector assembly of FIGS. 17A-17F and FIGS. 18A-18F.

DETAILED DESCRIPTION

Described embodiments provide a flat conductive fluid sensor cable a flat conductive fluid sensor cable capable of manufacture in long lengths. The flat conductive fluid sensor cable includes a flexible substrate, two or more flat conductors, and a fluid-permeable material. The fluid-permeable material allows a conductive fluid to form an electrically conductive path between the two or more conductors when conductive fluid contacts the conductive fluid sensor cable. For example, some embodiments include a substrate having an adhesive surface and extending in an extension direction. The fluid-permeable material is disposed over the substrate adhesive surface. First and second uninsulated flat conductors are each laterally positioned and electrically isolated from one another and positioned in a layer between the substrate and the fluid-permeable material. The first and second conductors each extend along the adhesive surface of the substrate in the extension direction. The substrate, first and second conductors, and fluid-permeable material are adhered together to form a laminated structure of the conductive fluid sensor cable. The laminated structure seals the first and second conductors between the substrate and the fluid-permeable material. The fluid-permeable material directly covers and contacts the first and second conductors. In the presence of conductive fluid, the fluid-permeable material permits conductive fluid to contact the first and second conductors and form a conductive path between the first and second conductors. An attached sensor detects the conductive path, which indicates the presence of the conductive fluid, and may generate a signal responsive to detecting the presence of the conductive fluid.

Figure 1A:
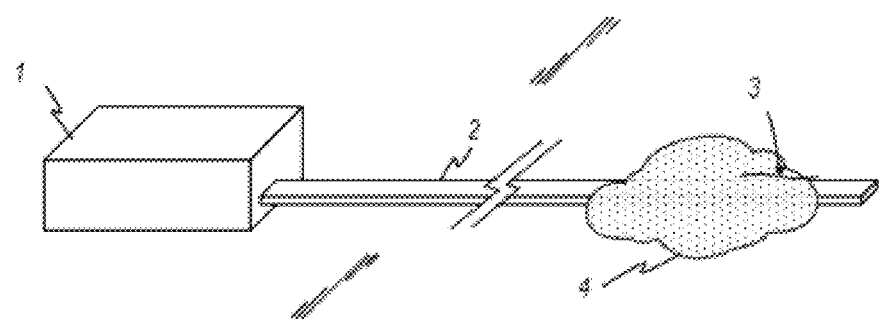
FIG. 1A is a perspective view of a conductive fluid sensor cable installed in an environment.

Turning now to the drawings, FIG. 1A depicts an environment having a conductive fluid sensing system installed therein. The conductive fluid sensing system includes a conductive fluid sensor 1 connected to a conductive fluid sensor cable 2. Cable 2 extends from the sensor 1 over a surface 3. If a body of fluid 4 flows into contact with the cable 2 (and across a pair of conductors embedded therein), the fluid forms a resistive connection across a pair of conductors in the cable 2. As used herein, the term "resistive connection" is a conductive path through which current flows and is characterized by the characteristic impedance of the conductive fluid medium through which current travels to enable current flow between conductors the cable. The conductive fluid sensor 1 detects a current flow between the conductors and indicates the presence of fluid on the surface 3.

Figure 1B:
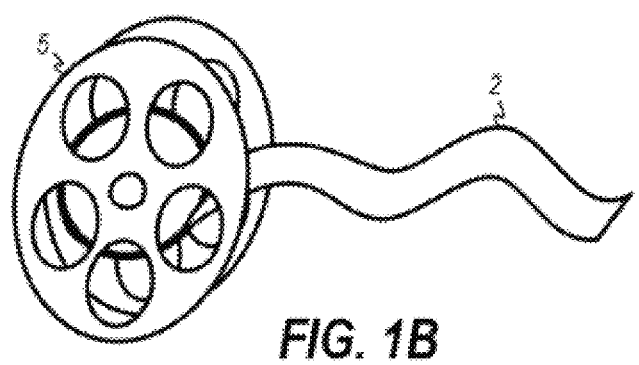
FIG. 1B is a perspective view of flexible cable wound on a spool.

In embodiments, the conductive fluid sensor cable 2 may be manufactured in long lengths, and when fabricated using flexible materials, may be conveniently stored on a spool 1 until ready for use, as illustrated in FIG. 1B. The conductive fluid sensor cable 2 is advantageously manufactured for low cost, ease of manufacture, and may be cut to any desired length for ease of fit and installation in the field.

FIGS. 2A-2D show an illustrative embodiment 10 of a conductive fluid sensor cable 2. As shown in FIGS. 2A-2D, cable 10 includes substrate 11, adhesive layer 12, conductive layer 13 and cover layer 14. Substrate 11 is defined by first and second surfaces $11_{top}$, $11_{bottom}$, and extends lengthwise in an extension direction, along a length L. Adhesive layer 12 having top and bottom surfaces $12_{top}$, $12_{bottom}$ is disposed having its bottom surface $12_{bottom}$ on top surface $11_{top}$ of substrate 11. Conductive layer 13 having surfaces $13_{top}$, $13_{bottom}$ is disposed having its bottom surface $13_{bottom}$ on top surface $12_{top}$ of adhesive layer 12, and cover layer 14 having surfaces $14_{top}$, $14_{bottom}$ is disposed having its bottom surface $14_{bottom}$ over and in contact with top surface $13_{top}$ of conductive layer 13 and portions 12d of top surface $12_{top}$ of adhesive layer 12. The conductive layer 13 includes isolated first and second conductors 13a, 13b disposed in side-by-side parallel spaced relationship extending in the extension direction of the substrate 11. In an embodiment, the top surface $14_{top}$ of cover layer 14 forms an exterior surface of the cable 10 while the bottom surface $14_{bottom}$ of cover layer 14 adheres to portions of the top surface $12_{top}$ of the adhesive layer 12 that are not covered by the conductors 13a, 13b, thereby sandwiching the conductors 13a, 13b between the adhesive 12 and cover layer 14 to securely hold the conductors 13a, 13b in place within the cable 10. The cover layer 14 includes cover material disposed in direct contact with both the first and second conductors and arranged to allow fluid contact between the first and second conductors and conductive fluid when the conductive fluid contacts the cable.

In an embodiment, the substrate 11 is formed of a flexible material (i.e., material that is bendable without breaking) such as polyimide or polyester, fabric, etc. The flexible material may also be formed from a normally rigid material (such as, without limitation, FR-4) that is thinned down to a few tens of micrometers in thickness to gain sufficient flexibility to bend without breaking. In other embodiments, the substrate may be formed using a rigid material, such as, by way of example and not limitation, FR-2 or FR-4—in such case the cable 2 will not be flexible.

In an embodiment, cover layer 14 is formed using a fluid-permeable material that allows fluid to penetrate through the layer 14 from its top surface $14_{top}$ through to its bottom surface $14_{bottom}$. In an embodiment, the cover layer 14 is implemented using a wicking material having non-conductive, moisture-absorbing, moisture-permeable properties that exhibits capillary action, or wicking, in the presence of fluid to pull fluid across and through the material. Since different wicking materials absorb fluid at different rates, through deliberate selection of the particular wicking material used as the cover layer 14, one can implement a coarse form of control over the rate at which a conductive connection is formed across the conductors 13a, 13b in the presence of conductive fluid. In an embodiment, the cover layer 14 is implemented using a wicking material formed of a fluid-absorbing material that swells or enlarges as it absorbs and retains fluid. The advantage of using such a swelling-type wicking material is that the wicking material is more likely to create fluid contact across the conductors 13a, 13b and maintain such fluid contact in the event that the wicking material is somewhat loosely formed across the conductors 13a, 13b. Additionally, depending on the type of swelling-type wicking material used, the rate at which a conductive connection forms between the conductors 13a, 13b in the presence of fluid may differ based on material type, providing an aspect of control over the reaction time of the conductive fluid sensing circuit. Without limitation, examples of suitable wicking materials include cotton, wool, rayon and other synthetic fabrics, braided materials, or other natural or synthetic absorbent or super absorbent materials, including fluid-permeable sleeves containing fluid-absorbing fluid-swelling material such as super absorbent gel or other material.

In an alternative embodiment, the cover layer 14 is implemented using a dielectric or other non-absorbing but fluid-permeable material such as a fluid-permeable film. In yet another alterative embodiment, the cover layer 14 is implemented using a non-fluid-permeable material that is deposited in non-contiguous sections arranged to form voids (i.e., absence of cover material) therebetween and therethrough. For example, the cover layer material may be applied and arranged as a plurality of dots, stripes, stippled sections low-resolution that may or may not be fluid permeable and that are arranged to form void sections (i.e., absence of the material) that expose portions of the cable conductors 13a, 13b through the cover layer 14. As a specific example provided by way of illustration and not limitation, the cover layer may be formed by spraying a low-resolution coat of silicone rubber or other elastomer or sprayable dielectric (or a B-stage adhesive that is later exposed to high heat or UV light for final cure), wherein the low-resolution coat comprises miniature dots arranged to form gaps or voids (i.e., absence of cover material 14) therebetween on the surface of the conductors 13a, 13b (as discussed below in reference to FIGS. 7A-7C). In such embodiments, the miniature dots form a protective cover 14 over the conductors 13a, 13b while leaving miniature voids exposing the conductors 13a, 13b and able to collect and retain fluid in fluid contact with the conductors 13a, 13b when fluid flows or over or collects on the top surface of the cable 10.

The cover layer 14 serves multiple purposes: (1) it is formed to allow fluid to permeate the cover of the cable to enable formation of a conductive connection across the conductors; (2) it assists in securing the conductors 13a, 13b in place within the structure of the cable 10 by forming, in conjunction with the adhesive layer 12, a fluid-permeable secured cover over the conductors 13a, 13b; (3) when such cover layer 14 is implemented using wicking material, it absorbs water or other conductive fluid and via capillary action wicks the fluid across the conductors 13a, 13b to more reliably ensure that a resistive connection is formed for the conductive fluid sensor 1 to detect; (4) the selection of the particular fluid-permeable material can be used as a coarse mechanical control over the rate at which the resistive connection is formed (either assisting in rapid connection or slowing down the formation of the resistive connection); (5) it assists in protecting the conductive layer 13 and adhesive layer 12 from environmental elements; and (6) in the absence of fluid it electrically isolates the conductors 13a, 13b from objects that come in contact with the exposed surface $14_{top}$ of the cover layer 14, thereby assisting in protecting people and objects from unintentionally causing a short or forming a resistive connection across the conductors 13a, 13b when such people or objects contact the cable 10.

In an embodiment, the cover layer 14 is a single unit (i.e., a single piece taken alone, or multiple pieces joined together to form a single piece) of fluid-permeable material that preferably covers all, or substantially all, of the first surface 13 top of the conductors 13a, 13b, and all, or substantially all, of the portions 12d of the first surface $12_{top}$ of the adhesive layer 12 that are not covered by the conductors 13a, 13b. Such an embodiment is depicted in FIGS. 2A-2E. In an alternative embodiment, as best depicted in FIGS. 5A-5B, 6A-6B, and 7A-7C, the cover layer 14 is implemented as a plurality of individual sections of fluid-permeable material, whereby each individual section forms a cover over corresponding portions of the conductors. Preferably, one or more of such individual sections of fluid-permeable material also adheres to and forms a cover over portions 12d of the adhesive layer 12, such portions 12d being laterally adjacent on each side of the conductors 13a, 13b. Fluid-permeable material formed over the conductors 13a, 13b and adhered on both sides of each conductor assists in ensuring that the conductors remain securely in place when exposed to environmental conditions. In some embodiments, cable 2 (e.g., cover layer 14) may be implemented in a desired color in order be less conspicuous, better blend with surrounding décor, and/or be more aesthetically pleasing.

In an embodiment, the layers 11, 12, 13 and 14 are arranged in the order illustrated in FIGS. 2A-2D. In an alternative embodiment, there may be additional layers (not shown) of various materials between the flexible substrate layer 11 and adhesive layer 12. In another alternative embodiment, the cover layer 14 may be eliminated altogether, such that the cable 10 comprises only the flexible substrate 11, adhesive 12 and conductors 13a, 13b. In an alternative embodiment, layer 14 may be implemented by way of a fluid-permeable sleeve or casement, such as a braided fiber sleeve which encapsulates (i.e., surrounds) the combined substrate 11, adhesive 12, conductive 13 layers.

Figure 2E:
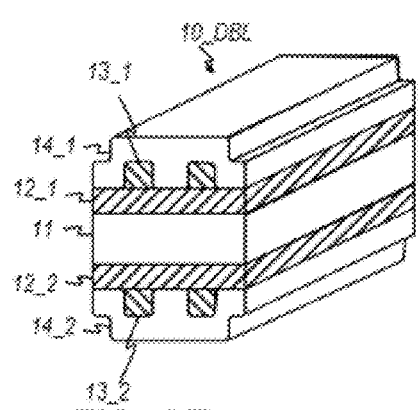
FIG. 2E is a perspective view of a portion of a double-sided version of the cable shown in FIG. 2A.

FIG. 2E depicts a double-sided version 10_DBL of cable 10, comprising substrate layer 11, adhesive layer 12 (referenced as 12_1), conductive layer 13 (referenced as 13_1), and cover layer 14 (referenced as 14_1) on one surface $11_{top}$ of the substrate, as shown in FIGS. 2A-2D, and additionally comprising a second adhesive layer 12_2 disposed on the second surface $11_{bottom}$ of the flexible substrate 11, a second conductive layer 13_2 disposed on the second adhesive layer 12_2, and a second cover layer 14_2 disposed on the second conductive layer 13_2 and portions of the second adhesive layer 12_2, as shown. Layers 12_2, 13_2 and 14_2 mirror layers 12, 13 and 14 (shown in FIG. 2E as 12_1, 13_1, 14_1) with the substrate 11 supporting each layered stack (12_1/13_1/14_1 and 12_2/13_2/14_2) on respective opposites surfaces $11_{top}$, $11_{bottom}$ thereof.

FIGS. 3A-3D depict an alternative embodiment 30 of conductive fluid sensor cable 2. As illustrated, cable 30 includes substrate 31, adhesive layer 32, conductive layer 33 and cover layer 34. As best seen in FIGS. 3A, 3C, 3C_a and 3D, adhesive layer 32 is disposed on substrate 31 in non-contiguous sections 35 that are dispose directly on the substrate 31. Conductive layer 33 is disposed over the adhesive layer 32 and includes conductors 33a, 33b that are electrically isolated from one another in the absence of conductive fluid. FIG. 3B_a is an enlarged view of portion 38 of FIG. 3B. As best seen in FIG. 3B_a, first portions 36 of a top surface of the adhesive sections 35 adhere to corresponding underside of portions of conductors 33a, 33b, and second portions 37 of the top portion of adhesive sections 35 adhere to corresponding underside portions of the cover layer 34. In other words, the conductors 33a, 33b are layered (perpendicularly) over the sections 35 of adhesive 32.

In an embodiment, as best seen in FIGS. 3B and 3B_a, the adhesive sections 35 include a plurality of adhesive stripes formed perpendicular to the extension direction of the cable 30. While illustrated as perpendicular stripes deposited on the substrate 31, sections 35 may be of any shape and size that meets the conditions of adhering at least portions of the conductors 33a, 33b and cover layer 34 to the substrate 31. For example, in alternative embodiments (not shown), the adhesive sections 35 may include a plurality of stripes arranged on the substrate diagonally to the extension direction of the cable 30. Other arrangements may include, without limitation formation on the substrate of crisscrossed stripes, or other non-contiguous shapes such as dots, stipples, spots, dashes, circles, rectangles, etc., so long as the adhesive 32 is formed on the substrate 31 such that the sections 35, either individually or in conjunction with other sections 35, adhere to portions of the underside of conductors 33a, 33b, and to portions of the underside of cover layer 34 in a manner so as to secure the conductors 33a, 33a in place between the substrate 11 and cover layer 34.

In the embodiment shown in FIGS. 3A-3D, the cable 30 may be formed to include only the substrate 31, adhesive layer 32, conductive layer 33 and cover layer 34 on a first surface 31a of the substrate 31. Optionally, as illustrated in FIG. 3E, a double-sided version cable 30_DBL may be formed by adding an adhesive layer 32_2, a conductive layer 33_2 and a cover layer 34_2 layered in that order on a second surface 31b of the substrate 31.

FIGS. 4A-4D depict an alternative embodiment 40 of conductive fluid sensor cable 2. As illustrated, cable 40 includes substrate 41, conductive layer 43, adhesive layer 42 and cover layer 44. Conductive layer 43 is disposed on substrate 31 and includes conductors 43a, 43b that are electrically isolated from one another in the absence of conductive fluid. Conductive layer 43 may include non-adhesive conductors 43a, 43b, or adhesive conductors. In an embodiment, the conductors 43a, 43b comprise conductive foil tape (comprising conductive foil with adhesive disposed on at least one side of the foil). Adhesive between conductive layer 43 and substrate 41 is not shown in FIGS. 4A-4E but may optionally be included to hold the conductors more securely in place on substrate 31. In an embodiment, the conductors 43a, 43b are printed directly onto the substrate 41 using conductive ink and therefore do not require an adhesive.

Adhesive layer 42 is disposed over the conductive layer 43. FIG. 4B_a is an enlarged view of portion 48 of FIG. 4B. As best seen in FIG. 4B_a, first portions 46 of a bottom surface of the adhesive sections 45 adhere to corresponding portions of the top surfaces of conductors 43a, 43b, and second portions 47 of the bottom portion of adhesive sections 45 adhere directly to the substrate 41. The top surface of the adhesive sections 45 adheres to corresponding underside portions of the cover layer 44. In an embodiment, as best seen in FIGS. 4B and 4B_a, the adhesive sections 45 include a plurality of adhesive stripes formed perpendicular to the extension direction of the cable 40. In other words, the adhesive layer 42 is disposed in non-contiguous sections 45 that directly contact portions of the top side of conductors 43a, 43b and portions of the top side of the substrate 41.

In alternative embodiments (not shown), the adhesive sections 45 may include a plurality of stripes arranged on the substrate 41 diagonally to the extension direction of the cable 40. Other arrangements may include, without limitation formation on the substrate 41 of crisscrossed stripes, or other non-contiguous shapes such as dots, stipples, spots, dashes, circles, rectangles, etc., so long as the adhesive 42 is formed on the substrate 41 such that the sections 45, either individually or in conjunction with other sections 45, adhere to portions 46 of the top of conductors 43a, 43b, and to portions 47 of the top of substrate 41, and wherein the top surface of adhesive layer 42 adheres to the underside of cover layer 44 in a manner so as to secure the conductors 43a, 43b in place between the substrate 11 and cover layer 44.

In the embodiment shown in FIGS. 4A-4D, the cable 40 may be formed to include only the substrate 41, adhesive layer 42, conductive layer 43 and cover layer 44 on a first surface of the substrate 41. Optionally, as illustrated in FIG.

4E, a double-sided version cable 40_DBL may be formed by adding an adhesive layer 42_2, a conductive layer 43_2 and a cover layer 44_2 layered in that order on a second surface of the substrate 41.

FIGS. 5A-5B show the top-down and cross-sectional side view of another alternative embodiment 50 of cable 2, wherein the cable 50 includes flexible substrate layer 51, conductive layer 53, and cover layer 54, as shown. Cover layer 54 may be fluid-permeable or non-fluid-permeable. Support layer 51 preferably comprises support tape such as polyethylene terephthalate (PET) or polyethylene naphthalate) (PEN). Conductive layer 53 preferably comprises copper or copper/tin, or other conductive, flat foil, wire or conductive ink. In embodiments wherein the cover layer 54 is non-fluid-permeable, cover layer 54 preferably comprises adhesive biaxially-oriented polyethylene terephthalate (BoPET) such as Mylar® or other adhesive dielectric film or sealant and is disposed along the extension direction, L, of the cable 50 leaving periodic openings 55 so as to expose sections 55a, 55b of the conductors 53a, 53b to the environment. Alternatively, the cover layer 54 comprises fluid-permeable material and still leaves voids 56. In an embodiment, the cable 50 may be further encased in a wicking material 56 such as cloth or fabric made from natural or synthetic fiber, fabric or fluid-permeable encased swelling materials.

FIGS. 6A-6B show the top-down and cross-sectional side view of another alternative embodiment 60 of cable 2, wherein the cable 60 includes flexible substrate layer 61, conductive layer 63, and cover layer 64, as shown. In this example, the cover layer 64 is applied as a one-piece layer of material and contains voids 66 (i.e., absence of the cover layer material) through which portions of the conductors 63a, 63b are exposed through the layer 64 to allow fluid flowing or collecting thereover to contact the conductors 63a, 63b. The cable assembly (61, 62, 63, 64) may be further covered by an external fluid-permeable cover or encased in an outer fluid-permeable sleeve 65 in order to cover the exposed portions of the conductors 63a, 63b through the cover layer voids 66. Substrate layer 61 preferably comprises support tape such as polyethylene terephthalate (PET), BoPET, or polyethylene naphthalate) (PEN). Conductive layer 63 preferably comprises copper or copper/tin, or other conductive, flat foil, wire or conductive ink. Cover layer 64 preferably comprises adhesive BoPET such as Mylar® or other adhesive dielectric film or sealant. Alternatively, cover layer 64 may be fluid-permeable material.

FIGS. 7A-7C illustrate an embodiment 70 of a cable 2, having a substrate layer 71, adhesive layer 72, conductive layer 73 comprising conductors 73a, 73b, and cover layer 74, wherein the cover layer 74 includes a plurality of microdots 75 disposed over the conductive layer 13 and exposed portions of the substrate/adhesive layer(s) 71/72, for example by applying a low-resolution spray of material over the top surfaces of the conductors and exposed portions of the substrate/adhesive layer(s) 71/72. As best seen in FIG. 7B, which shows an enlarged portion 79 of the top surface of cable 70 from FIG. 7A, the cover layer 74 is formed of a plurality (in the thousands or more) of microdots 75 formed with voids therebetween so as to allow fluid to penetrate the layer 74 and contact portions of the conductors 73a, 73b. For example, a microdot 75a covers a portion of conductor 73a and a microdot 75b covers a portion of conductor 73b, but there exist voids between it and other microdots. Thus, conductors 73a and 73b remain partially exposed to contact by penetrating conductive fluid, yet, the large volume of microdots operates to form a low-resolution protective outer cover for the cable 70.

It is to be understood that any of the cover layers 54, 64 or 74 described in FIGS. 5A-5B, 6A-6B, and 7A-7B may be used as the implementation of any of the respective cover layers 14, 34 or 35 in the embodiments shown in FIGS. 2A-2E, 3A-3E, and 4A-4E. Additionally, it is to be understood that each of the cable embodiments 10, 30, 40, . . . 90 may be further encased in a fluid-permeable sleeve or otherwise covered in fluid-permeable material (in addition to the respective cover layers included in the respective cable embodiments).

FIGS. 8A-8D illustrate another alternative embodiment 80 of cable 2. In this embodiment, the cable 80 includes substrate layer 81, adhesive layer 82, and cover layer 84 having at least one pair of mutually isolated conductors 83a, 83b woven, threaded, knitted, braided or otherwise integrated into the cover layer 84. In an embodiment, the conductors 83a, 83b comprise conductive thread, conductive flat tape, wire or other conductive material. Cover layer 84 having conductors 83a, 83b integrated therein is adhered to substrate layer 81 by adhesive layer 82.

Adhesive layer 82 may comprise a continuous body of adhesive on which cover layer 84 and portions of the threaded conductors 83a, 83b are disposed. In an alternative embodiment (not shown in FIGS. 8A-8D, but implemented similar to how the sections 35 shown in FIGS. 3A-3D are implemented), the adhesive layer 82 is disposed on the substrate 81 in non-contiguous sections that are positioned on the substrate 81 such that when the cable 80 is assembled, first portions of the adhesive sections adhere to the conductors 83a, 83b, and second portions of the adhesive sections adhere to portions of the cover layer 84. In an embodiment, similar to the implementation shown in FIGS. 3A-3D, the adhesive sections comprise a plurality of adhesive stripes formed perpendicular to the extension direction of the cable 80. In alternative embodiments, the adhesive sections may comprise a plurality of stripes arranged diagonally to the extension direction of the cable 80, or may be formed as cross-hatching (crisscrossing the adhesive to form holes in the adhesive layer) or other non-contiguous shapes such as dots, dashes, circles, rectangles, etc., wherein the adhesive 82 is formed on the substrate 81 such that adhesive sections, either individually or in conjunction with other adhesive sections, adhere to portions of the conductors 83c, 83d, and to portions of the cover layer 84 in a manner so as to secure the conductors 83c, 83d in place by way of the adhesive 82 and the cover 84.

In an embodiment, portions 85 of the conductors 83a, 83b are exposed on the external surface of the cable 80 while other portions of the conductors 83a, 83b, are protected within or under the exposed surface of the cover layer 84. The size of the exposed portions 85 of the conductors 83a, 83b depends on the stitch size and/or weave or stitch pattern. In an alternative embodiment, illustrated in FIG. 8E, the cover layer 84 is characterized by a pile (characterized by thickness $t_{pile}$) that protrudes a distance $t_{pile}$ on the outer surface beyond the protrusion $t_{conductor}$ of the conductors 83a, 83b on the outer surface of the cable 80 such that conductors 83a, 83b are substantially protected from external contact by objects and people due to the density and pile of the material of the cover layer 84. A thicker fabric pile $t_{pile}$ on the exterior surface of the cable 80 allows the fabric of the cover layer 84 to serve as a weak insulator between the exposed conductors 83 and objects that come into contact with the fabric pile on the outer surface of the cable 80.

FIGS. 9A-9E illustrate yet another alternative embodiment 90 of cable 2. In this embodiment, the cable 90 includes substrate layer 91 having at least one pair of mutually isolated conductors 92a, 92b woven, threaded, knitted, braided or otherwise integrated into the substrate layer 91. In an embodiment, substrate layer 91 comprises cloth, fabric, or mesh that is capable of absorbing and wicking liquid. The conductors 92a, 92b comprise conductive thread, conductive flat tape, or wire. Similar to the discussion in connection with FIGS. 8A-8E, conductors 92a, 92b may be more or less exposed depending on the pile $t_{pile}$ of the substrate layer 91 relative to the pile $t_{conductor}$ of the conductors 92a, 92b, and/or weave or stitch pattern.

Notably, each cable embodiment 10, 30, 40, . . . , 90 illustrated in the figures is shown, for convenience of understanding, with exaggerated dimensions. In particular, the thicknesses of the individual layers relative to the width in each depicted embodiment 10, 30, 40, . . . 90, is exaggerated in order to be able to illustrate the construction of the respective cable. In practice, each cable embodiment will typically be on the order of a few millimeters wide, a hundred or more micrometers thick, and a few centimeters up to meters long. In an illustrative embodiment, for example, the cable 10 may have spacing between conductors of 3 mm, and may have example dimensions as shown in Table 1 below:

TABLE 1

| layer | width | thickness |
|---|---|---|
| substrate | 3 mm | 0.043 mm |
| conductors | 0.7 mm | 0.035 mm |
| cover | 3 mm | 0.043 mm |

Various materials may be used for each of the substrate, base, adhesive, conductor, and wicking/cover layers in each of the embodiments 10, 30, 40 . . . , 90 of cable 2. The substrate/support/base layer(s) may be implemented, by way of example and not limitation, using dielectric material such as biaxially-oriented polyethylene terephthalate (BoPET), polyethylene terephthalate (PET), polyethylene naphthalate (PEN) or other polyester or polyamide films or electrically insulative materials. The substrate/support/base layer(s) may also be implemented using wicking material such as cloth, fabric, mesh, etc. constructed with natural or synthetic non-conductive fibers. Preferably, the substrate is flexible, as discussed herein; alternatively, the substrate may be rigid or semi-rigid, for example using materials such as FR-2 or FR-4.

Examples of adhesive material include, without limitation, non-conductive resins, adhesives and/or epoxies. In some embodiments, the adhesive is a B-stage adhesive that can be applied by dispensing or printing and then partially cured using a latent (low reactivity) curing agent so that it remains in a bondable state. Once the components (e.g., substrate, conductors, cover layer) are placed, the B-stage adhesive is exposed to high heat or UV light for final cure. In an embodiment, the combination of substrate and adhesive layers is pre-manufactured adhesive flexible BoPET tape, such as Mylar®, Melinex, and Hostaphan adhesive tapes. It is to be understood that the adhesive is characterized by electrical insulative properties to prevent current flow between the conductors through the adhesive. Further, in embodiments where the conductors may have portions that directly contact the substrate, it is to be understood that the substrate itself must accordingly be electrically insulative in order to prevent current flow between the conductors through the substrate.

The conductive layer, or conductors, are implemented using conductive material such as, but not limited to, silver, silver ink, copper, tin-plated copper, gold, nickel, aluminum, etc. The conductors in each of the embodiments 10, 20, . . . , 90 are preferably flat conductive foil (which may include an adhesive tape, flat wire, or printed conductive ink, but could also be round wire, conductive thread, conductive traces, etc.

In an embodiment, the substrate and conductive layer together comprises flat flexible cable (FFC) manufactured using BoPET tape and flat foil laminated or adhered thereon. Wicking/cover layer is adhered to the FFC using a B-Stage adhesive. Such construction supports a very inexpensive manufacturing process, a durable cable, and facilitates accurate reliability by water sensors connected to the cable.

Thus, described embodiments may be formed having adhesive only on the substrate layer, and not on the cover layer. For example, a B-Stage adhesive may be disposed on the substrate layer, and the conductors placed and adhered on the substrate layer. The cover layer, which is a fluid-permeable material, is adhered to the adhesive disposed on the substrate layer that is not covered by the conductors. Thus, adhesive is not disposed on the cover layer, allowing the cover layer to remain fluid-permeable, and thus to operate as a fluid sensor.

In operation, each cable embodiment 10, 20, . . . , 90 serves as a conductive fluid sensor cable (to be operated in conjunction with a conductive fluid sensing circuit) by exposing (through a fluid-permeable layer or a cover layer arranged to form voids therethrough) electrically isolated conductors embedded within the cable to the environment in which the cable is installed. When conductive fluid comes into contact with the cable 102, the cover layer (achieved via fluid-permeable material and/or leaving voids between the layer material) allows fluid to permeate the layer. When the cover layer is implemented using wicking material, the wicking material absorbs the fluid, pulling it through the wicking material to ensure that the fluid forms a conductive fluid body that forms a resistive connection between the otherwise isolated (i.e., in the absence of fluid) conductors. The wicking material, through capillary action, enhances the likelihood that the fluid will span both conductors to ensure detection of the presence of fluid. The conductors of the cable 102 connect to a conductive fluid sensing circuit (discussed hereinafter) which detects and indicates the presence of conductive fluid based on current flow through a resistive connection formed by conductive fluid across the conductors of the cable 102.

FIG. 10 shows an illustrative conductive fluid sensing system 100. System 100 includes a conductive fluid sensing circuit 121 having first and second input nodes 122a, 122b, electrically connected to an input connector 123. Connector 123 is configured to receive, retain and electrically connect input nodes 122a, 122b to respective first and second conductors 103a, 103b of a conductive fluid sensor cable 102 upon insertion of one end of such cable 2 into the connector 123. In an embodiment, the conductive fluid sensing circuit 121 comprises a switch circuit 125 that generates on switch output node(s) 124 one or more driving signal(s) whose state(s) indicate the presence, or lack or presence, of conductive fluid across the conductors 103a, 103b on cable 102. Electronic switches are well-known in the art; therefore the switch circuit 125 may be implemented according to any suitable switching circuit that produces a driving signal based on current flow or measured resistance across the conductors 103a, 103b when the cable 102 is connected to the conductive fluid sensing circuit 121.

Referring to FIG. 11, and without limitation, in one embodiment the electronic switch 125 in the conductive fluid sensing circuit 121 comprises a PNP-type transistor 126 having an emitter terminal E connected to a voltage source Vcc, a collector terminal C connected through a current limiting resistor R1 to a circuit ground, and a base terminal B connected through a current limiting resistor R2 to the circuit Vcc and also through a current limiting resistor R3 to one of the input nodes 122a of the connector 123. The other input node 122b is connected to the circuit ground. The driving signal on node 124 is connected at the transistor collector C. In the absence of conductive fluid across the conductors 103a, 103b of the cable 102, the transistor 126 is in cutoff mode and no current flows between the emitter E and collector C. When conductive fluid forms a pathway connecting the conductors 103a, 103b, a resistive connection (shown as resistance R4) allows current flow across R2, driving down the base-emitter voltage VBE. When there is sufficient current flow across R4, the base-emitter voltage VBE is driven down sufficiently to overcome the threshold voltage VT of the transistor 126, allowing current flow from emitter E to collector C, and ultimately driving the driving signal node 124 to voltage level close to Vcc (corresponding to a high level logic level) that is used by subsequent circuitry. As would be appreciated, other embodiments may implement other analog and/or digital circuits as part of conductive fluid sensing circuit 121 than the embodiment shown in FIG. 11.

Connector 123 may be implemented in various ways to receive, retain and electrically connect the cable 102 to the conductive fluid sensing circuit 121. Preferably, the connector 123 allows a cable 102 to be inserted, and then later removed, to allow the cable to be easily installed and replaced without needing to open the housing of the conductive fluid sensing circuit 121 and/or solder the connections.

In an embodiment the connector 123 comprises a zero-insertion force (ZIF) connector that is configured to receive an FFC cable. In such embodiment, the terminating end of the cable to be inserted into the ZIF connector will typically require a stiffener added to the end of the cable. FIGS. 12A and 12B depict an example terminating end 18 of a cable 2 that may be implemented on the end of, for example, the cable 10 from FIGS. 2A-2D. As illustrated in FIG. 12B, a terminating end 18 of cable 10 may include a stiffener 16 adhered with adhesive 15 on the underside of the substrate 11 at the terminal end 18 of the cable. Additionally, the cover 14 does not extend fully to the terminating end 18 in order to expose the conductors 13a, 13b for connection to the conductive terminals of the ZIF connector (not shown). In an embodiment, the stiffener 16 preferably includes support tape such as polyethylene terephthalate (PET) or polyethylene naphthalate (PEN).

In an embodiment, the connector 123 is integrated into the circuitry and housing of the conductive fluid sensing circuit 121 and includes features that allow an end of a cable 20 to be inserted into and retained by the connector 123 whereby the connector forms an electrical connection between conductors 103a, 103b of the cable 102 and the connector input nodes 122a, 122b of the conductive fluid sensing circuit 121. Preferably, the connector 123 is self-contained and requires no external crimping tool to electrically connect the cable 102 to the circuit 121. Preferably, the connector 123 also does not require any additional termination structure or support on the end of the cable—for example, the connector connects to a raw end of a cable wherein the raw end of the cable does not include any additional stiffener, connector, or other structure.

FIGS. 12A-12L illustrate an embodiment 200 of a connector 123 that can be used to connect a cable 2 to the conductive fluid sensing circuit 121, and can be used to attach to a raw end of the cable (i.e., no additional connector, terminating stiffener or other structure implemented on the end of the cable), thus allowing a conductive fluid sensor cable to be cut to any length and immediately used without having to add an additional interface to attach to the connector 123.

Figure 13C:
Figure 13D:
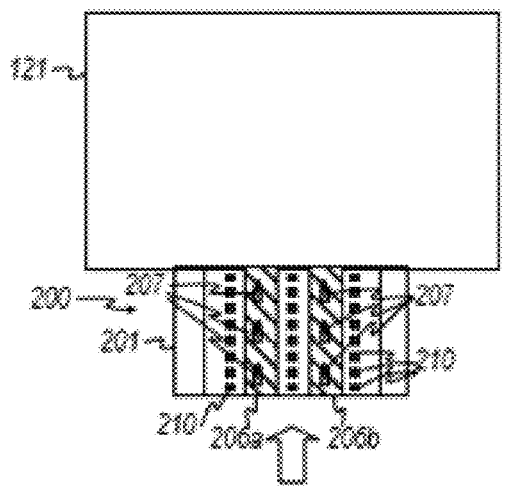
Figure 13D:
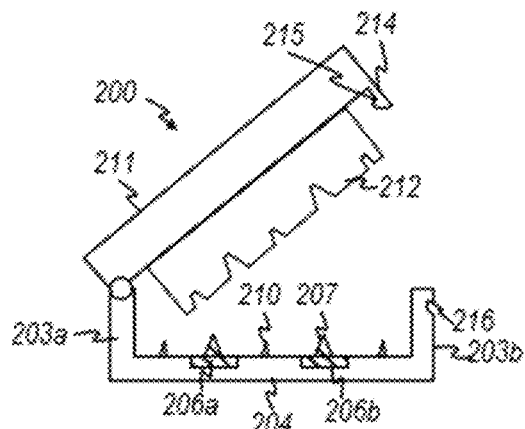
Figure 13E:
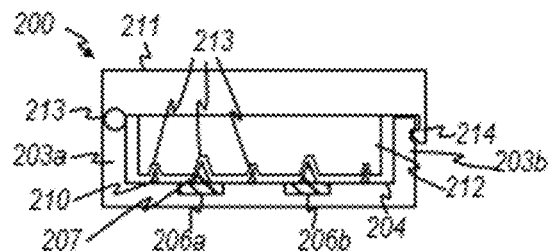
Figure 13A:
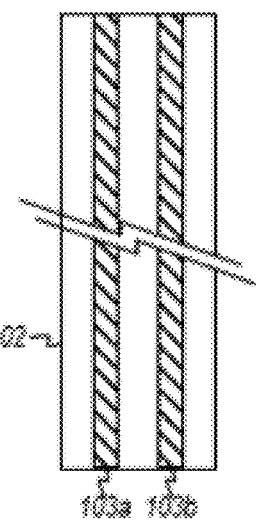

FIG. 13A is a plan view showing the connector 200 attached to the sensing circuit 121. As best seen in FIG. 13C, the connector 200 has a body having a channel for receiving an end of a cable 102. The channel includes a planar base section and a pair of perpendicular sidewalls situated one on each side of the planar base section. The interior planar base section is substantially the width of the cable plus a small relative tolerance to allow for loose insertion and fit, yet tight enough that a cable being inserted therein is naturally guided by, and substantially centered between, the sidewalls of the channel. The channel of the housing includes a pair of conductive rails seated or otherwise embedded on the planar base section. The spacing of the conductive rails is such that the rails line up with the conductors 103a, 103b on the cable 2 when the cable 102 is inserted into the connector channel. In other words, the spacing and pitch of the rails substantially matches the spacing and pitch of the conductors on the cable 102. Each conductive rail includes a plurality of piercing protrusions which protrude outwardly from the rail and into the space defined by the channel. In an embodiment, the piercing protrusions each have a smooth base section oriented towards the entrance of the channel and at least one piercing tip oriented towards the rear of the channel. This allows a cable to slide along the smooth base sections of the protrusions yet not be pierced by the piercing protrusions when the cable is being inserted, allowing for easy installation.

Figure 13B:
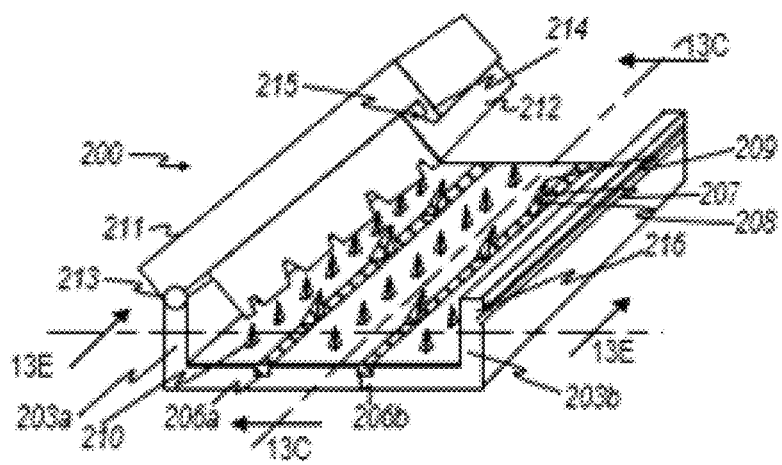
Figure 13F:
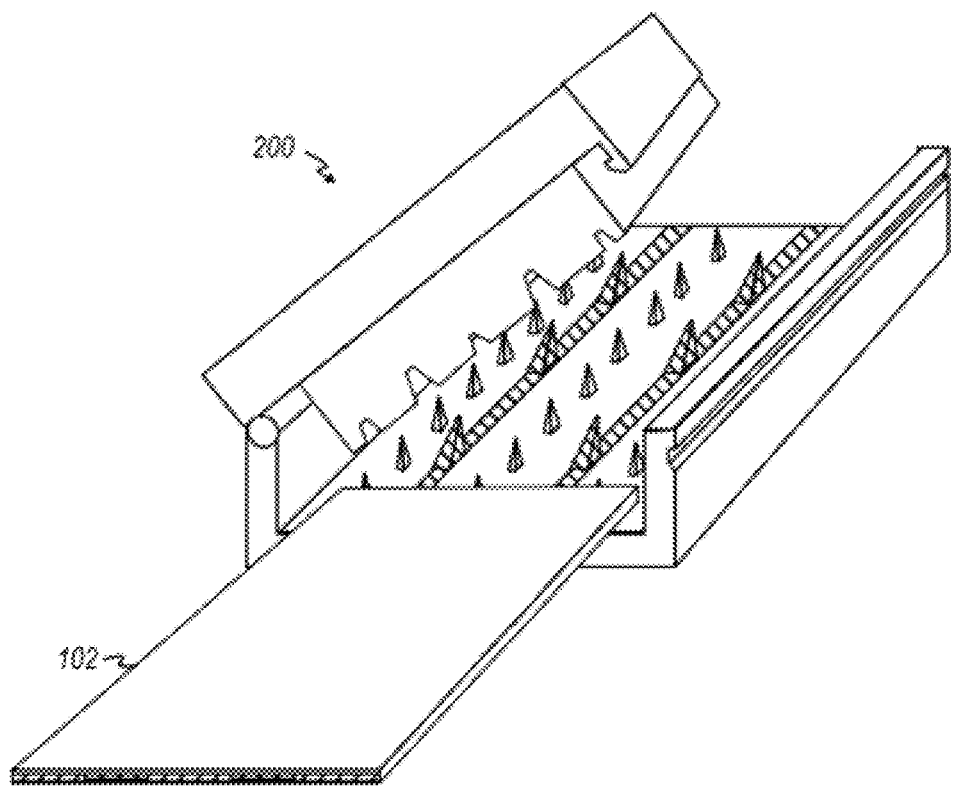
Figure 13G:
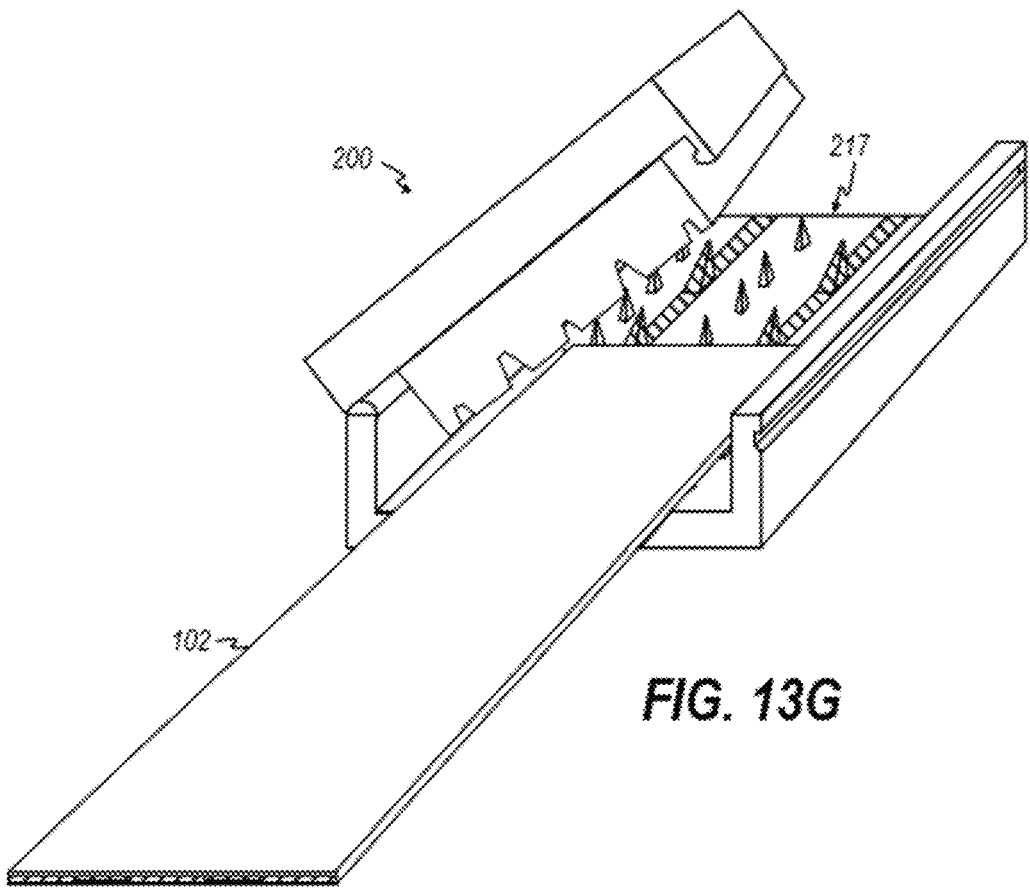

As best seen in FIGS. 13B and 13C, the planar base section may also include one or more retainer protrusions, which may be formed in the molded connector body, or alternatively may be seated or otherwise embedded in one or more of the areas of the planar base section that is not occupied by the conductive rails. In an embodiment, the retainer protrusions are piercing pins that will pierce non-conductive portions of the cable 102 when an end of the cable 102 is inserted into the channel and the retention cover is seated thereover. In an embodiment, the retainer protrusions also are characterized by a smooth base section and oriented with the smooth sections toward the entrance of the channel. Alternatively, the retainer protrusions do not protrude as far from the surface of the planar base section as do the piercing protrusions of the conductive rails, as best seen in FIG. 13B. In this manner, the retainer protrusions do not interfere with the insertion of the cable into the channel during the insertion of the cable.

Figure 13H:
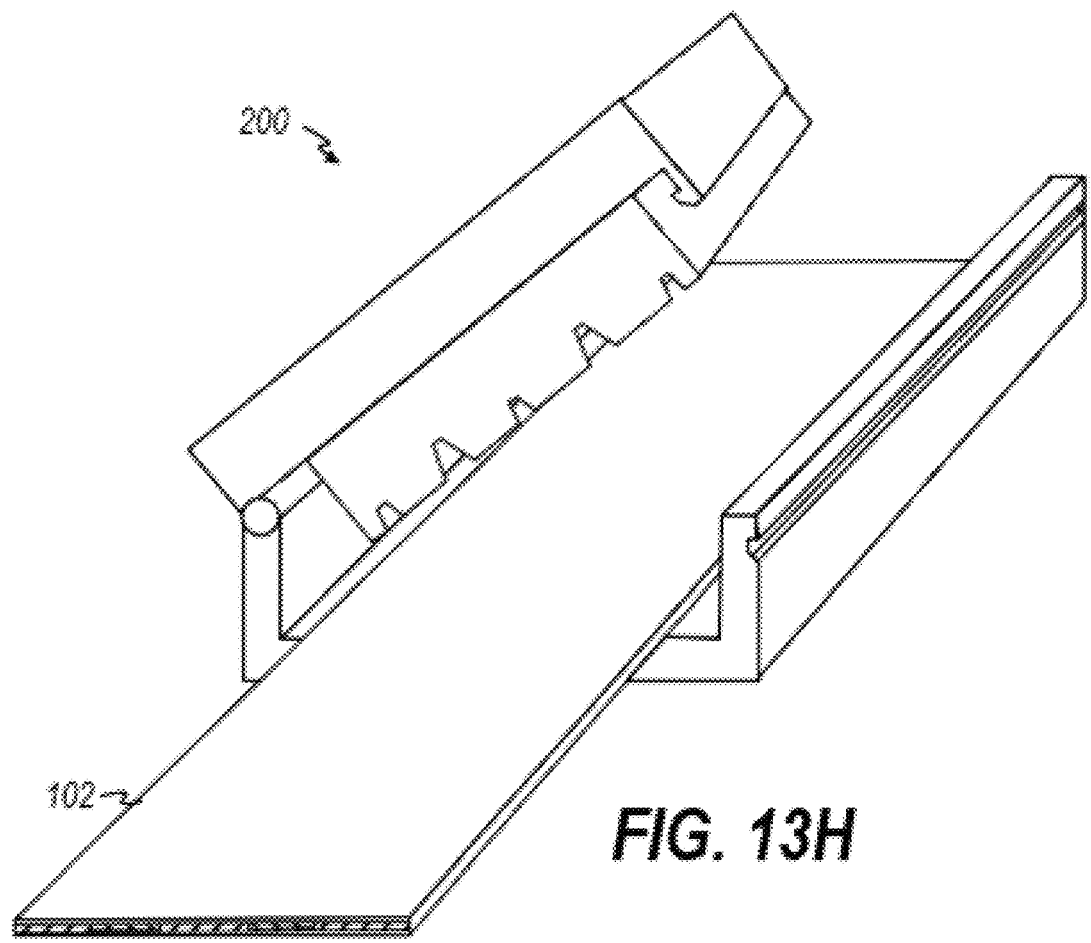
Figure 13I:
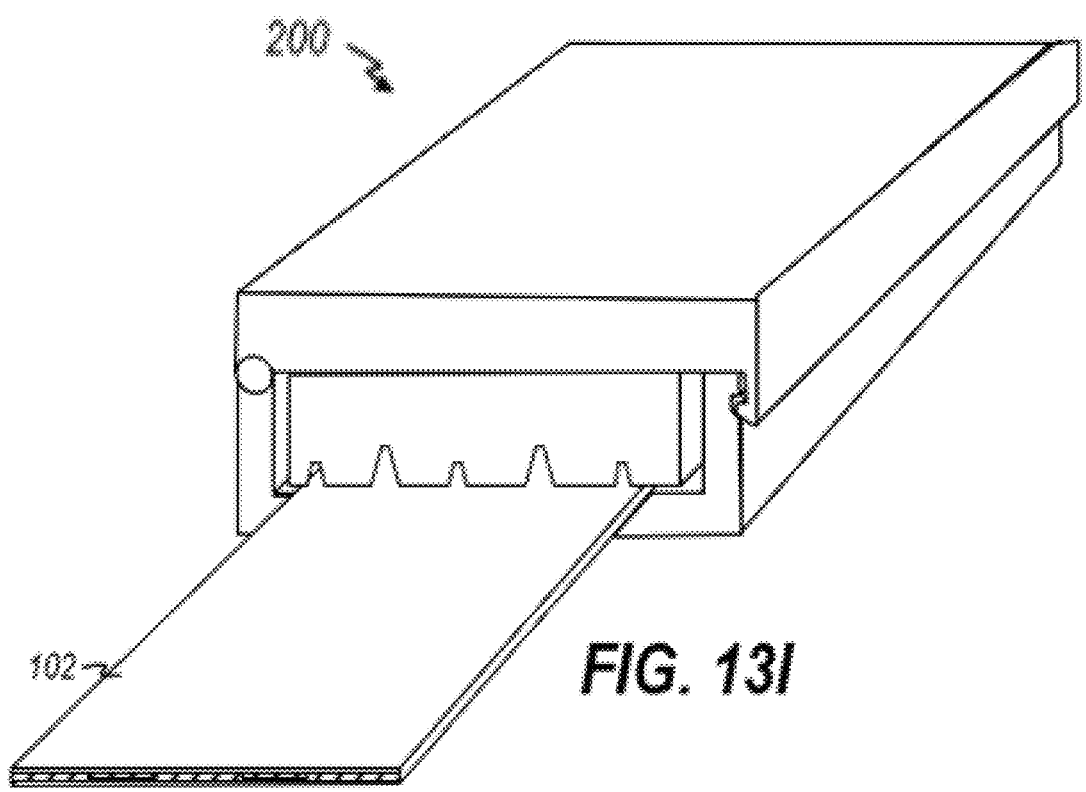

The connector 200 also includes a retention cover having attached or molded on its underside a molded compression block that includes cavities or indentations positioned to substantially conform to the respective positions of the piercing protrusions and retainer protrusions in the channel when the retention cover is property fitted over the channel. The retention cover is attached along the upper edge of one sidewall of the channel housing by a hinge, which allows the cover to be rotated from an open position (FIG. 13D) to a closed position (FIG. 13E). The retention cover further includes a retention clip. In an embodiment, the retention clip is molded into the cover on the edge opposite the hinge. The retention clip includes a hooked edge which mates with an opposing hooked edge formed within the outer surface of the non-hinged sidewall. Thus, with reference to FIGS. 13F-13L, in operation, with the retention cover in an open position, a cable 102 is placed at the entrance of the connector channel (FIG. 13F), and then slid toward the rear of the channel (FIG. 13G) until it contacts the rear wall of the channel (FIG. 13H). The retention cover is then rotated into a closed position FIG. 121. As the retention cover rotates into the closed position, the compression block contacts the cable 102 and exerts pressure onto the surface of the cable 102, which in turn presses the opposite surface of the cable 102 onto the piercing protrusions of the rails and retention protrusions of the channel. As best seen in FIGS. 13J-13L, as the retention cover is rotated fully into place, the piercing protrusions of the rails pierce through the substrate, conductors and cover of the cable 102, and in particular pierce the conductors 103a, 103b of the cable 102, thereby forming an electronic connection between the cable conductors 103a, 103b and input nodes 122a, 122b of the circuit 121. Similarly, the retention protrusions of the channel pierce the cable 102 in areas where the conductor is not present, thereby forming a retaining hold on the cable so that it is held securely in place within the channel of the connector 200.

Referring again to FIG. 10, driving signal(s) D present on driving signal node(s) 124 may be advantageously used to drive subsequent circuitry. For example, in an embodiment, driving signal(s) D on node(s) 124 drives one or more input(s) of a processor 120 which drives other circuits to effectuate various actions based on state of the driving signal(s) D output (on node(s) 124) by the conductive fluid sensing circuit 121. The processor 120 may be, by way of example and not limitation, a central processing unit (CPU), a microprocessor, Application Specific Integrated Circuit (ASIC), a programmable logic array (PLA), etc. The processor 120 may be connected via a bus (not shown) to computer memory 127 such that the processor 120 can access programming instructions and/or data stored in the memory 127. By way of example and not limitation, memory 127 may be one or more of RAM, ROM, PROM, FPROM, FEPROM, EEPROM, flash, or any other suitable computer-readable storage memory or component now known or hereinafter developed. Driving signal D from the conductive fluid sensing circuit 121 may drive, directly or indirectly (for example, via processor 120 as shown in FIG. 10, or through additional circuitry (not shown)) one or more alarm devices/circuits, such as an audio alarm 128, a visual alarm such as lighting LED or other light(s) 129 or displaying text or graphics on a display 130. The driving signal D present on driving signal node 124 may further be used, directly or indirectly, to actuate automatic shut off valves and/or control relays 131.

Actuation of any of the devices 128, 129, 130, 131 may be effectuated directly by direct electrical connection of node 124 to an input of a respective actuation device 128, 129, 130, 131. Alternatively, actuation may be effectuated indirectly by way of one or more intermediate circuits, electrical devices, controls and/or network communication(s). For example, in FIG. 10, actuation device 128, 129, 130, 131 are each controlled by processor 120 which actuates such respective device(s) in response to the state of the driving signal(s) D on node 124. In an embodiment, actuation of devices 128, 129, 130, 131 may further be based on input from one or more other sensor(s) 134, including without limitation sensor(s) which detect temperature, humidity, location, etc. In an alternative embodiment, the driving signal(s) D on node(s) 124 could be connected directly to one or more of actuation devices 128, 129, 130, 131 to effect direct actuation of such device(s).

Processor 120 may further be configured to control one or more transmission module(s) 132 in order to transmit an alert such as a text message, a phone call, an email, etc. Transmission module(s) 132 send information indicating the presence (or lack of presence) of conductive fluid across the conductors 103a, 103b of the conductive fluid sensor cable 102, and/or current and/or resistance measurements base thereon. In embodiments, the transmission module(s) 132 may include one or more of a cellular modem and antenna, an IEEE 802.11 a/b/g/n WiFi module with antenna, or an RF transceiver and antenna that implements transmission protocols in other RF bands and corresponding suitable transmission protocols (e.g., the ISM bands, 433 MHz or 915 MHz, Bluetooth, Zigbee, etc.). The conductive fluid sensing system 100 may further include additional circuitry, such as but not limited to a Subscriber Identity Module (SIM) card 135 for use with a cellular transmission module, a GPS module 133 for detection and use or transmission of GPS coordinates, other sensors 134 such as temperature sensors, humidity sensors, etc. The system 100 includes one or more power sources 136. In an embodiment, the system 100 is self-powered using one or more battery source(s). In some embodiments, the power source 136 may alternatively or additionally include an AC/DC converter and connect to AC power via an AC power outlet connected to the power grid or other AC source. In some embodiments, the battery source(s) may be rechargeable, for example via the AC/DC converter and AC source, via a solar cell, or other similar sources.

With reference to FIG. 14, in an embodiment, the conductive fluid sensor cable 2 may be used in connection with a water sensor alert notification system. In an embodiment, one or more conductive fluid sensing systems 320a, 320b, 320m including conductive fluid sensor cables attached thereto (such as individual systems 100 of FIG. 10 with cable 102 attached thereto) are installed in an environment 300. If and when a conductive fluid sensing system 320a, 320b, 320m is triggered due to the detection of conductive fluid on its respective connected cable, the respective system 320a, 320b, 320m formulates a message and transmits to a communications hub 310. The communications hub 310 receives the message and sends a corresponding message to a Notification Service 330 executing on an Internet-enabled computer (such as in the Cloud), which further notifies a user via an in-App notification on a mobile device, a text message, an email, a phone call, etc. In an embodiment, the sensing systems 320a, 320b, 320m each include an antenna 321a, 321b, 321c tuned to transmit messages using a protocol such as 433 MHz, 915 MHz, Bluetooth, Zigbee, or WiFi. The hub 310 includes a local range antenna to receive messages from the sensing systems 320a, 320b, 320m and further includes a long-range antenna for transmitting messages to a remote notification service 330. In an embodiment, the long-range antenna and transmission modules implement one or more mid- and/or long-range protocols including WiFi, cellular (such as LTE, LTE-CAT-M1, LTE-NB-IoT, etc.), and other Internet Protocols. The transmission may further actuate other electrical and/or mechanical devices such as automatic water shutoff valves, relays, and other mechanical controls.

Although shown in FIG. 13A-E as including two conductors 103a, 103b, any number of conductors may be employed. For example, as shown in FIGS. 15A-B, one embodiment of cable 102 may include 3 conductors, 1502a, 1502b, 1502c. In an embodiment, two of the conductors 1502 may be coupled together by a jumper (not shown), and the other conductor 1502 may remain electrically isolated from the other two conductors. In such an arrangement, a break in cable 102 could be detected (e.g., by conductive fluid sensing system 100), since coupling two of the conductors 1502 together would form a current path circuit that originates from and returns to sensing system 100. If cable 102 were broken, the circuit path formed by the coupled conductors 1502 would also be broken. Having a third, electrically isolated conductor would also allow for a conductive fluid to form a current path between one or both of the coupled conductors and the electrically isolated conductor, thereby providing fluid sensing capabilities in addition to sensing a broken cable. Other numbers of conductors may be envisioned for other beneficial purposes.

FIG. 15B shows a side view of cable 102 that includes substrate 1504 (and optionally an adhesive layer (not shown)), conductive layer 1502', and cover layer 1506. In some embodiments, the entire thickness of cable 102 might be approximately 0.013 inches, and the width of cable 102 might be approximately 0.4 inches. In some embodiments, conductive layer 1502' might be approximately 0.003 inches and each conductor 1502a, b, c, might be approximately 0.062 inches in width, and each conductor may be separated by a gap of approximately 0.038 inches. In some embodiments, substrate layer 1504 might include polyester having a thickness of approximately 0.001 inches and adhesive having a thickness of approximately 0.0015 inches.

Figure 16A:
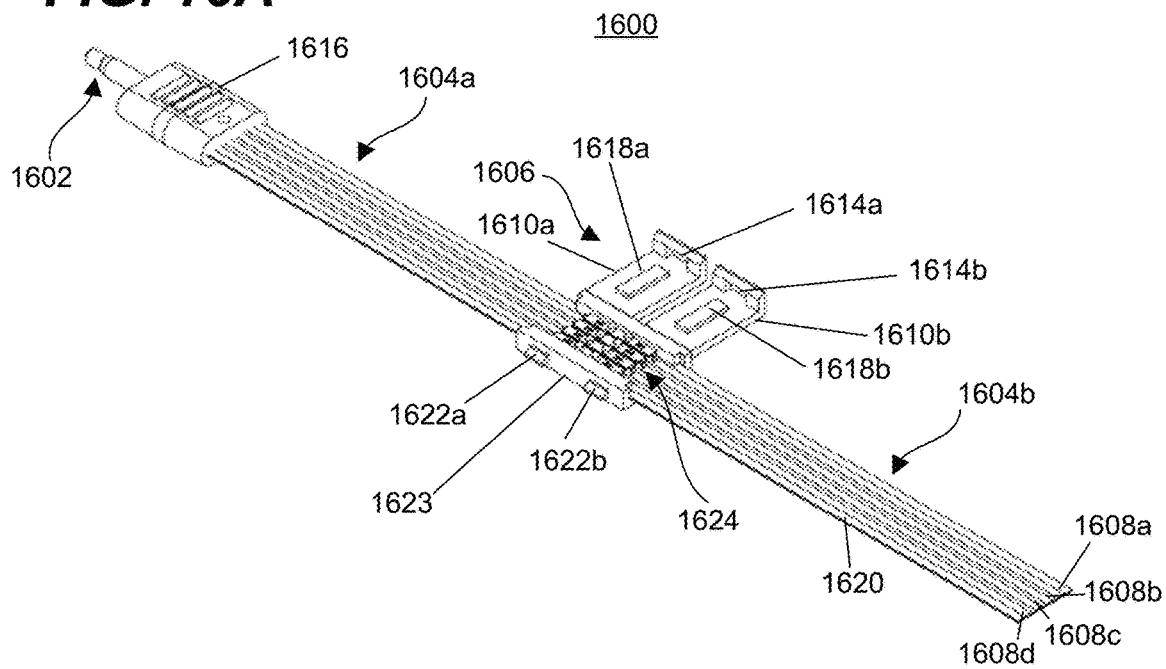
Figure 16B:
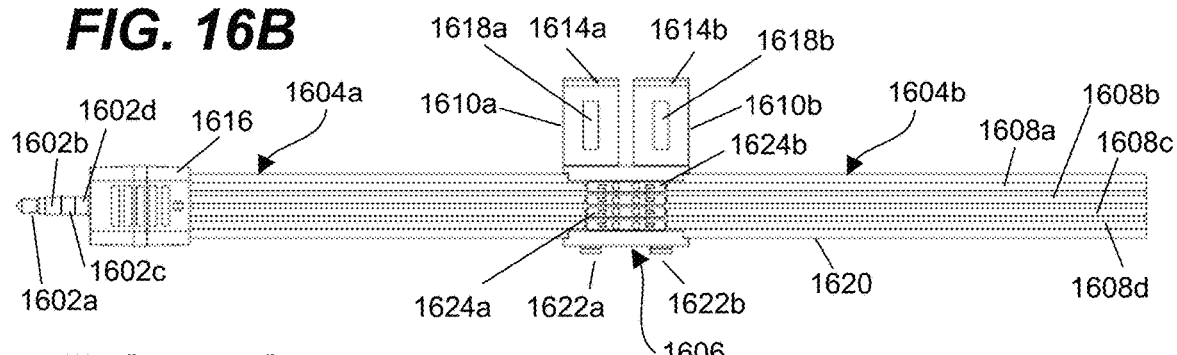
Figure 16C:
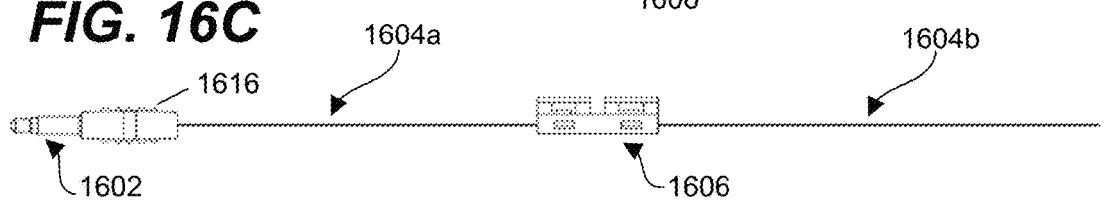
Figure 16D:
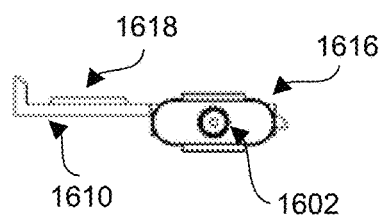
Figure 17A:
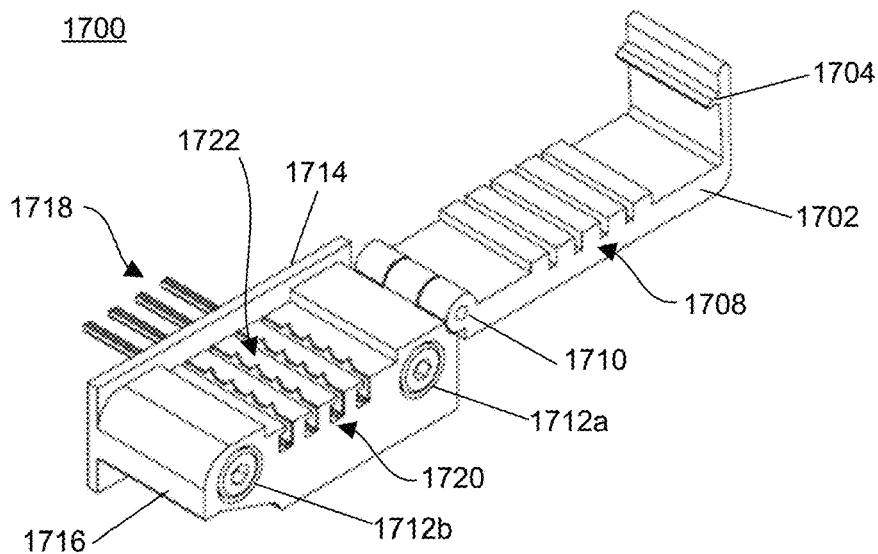
Figure 17B:
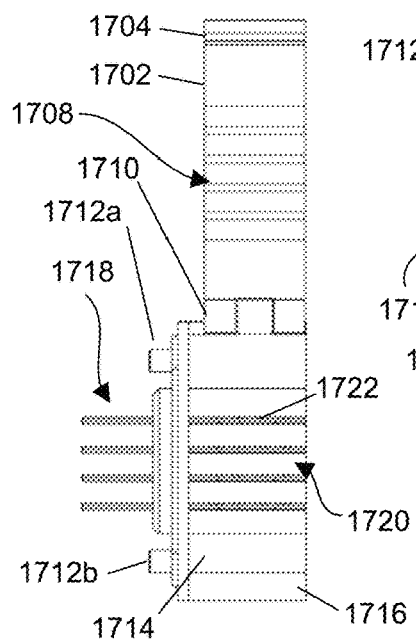
Figure 17C:
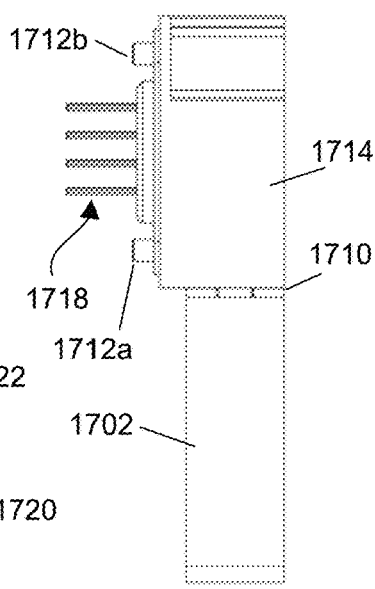
Figure 17D:
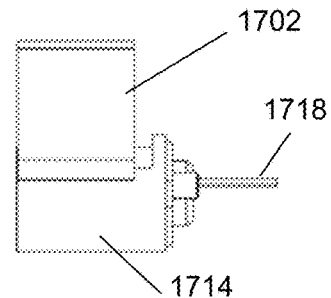
Figure 17E:
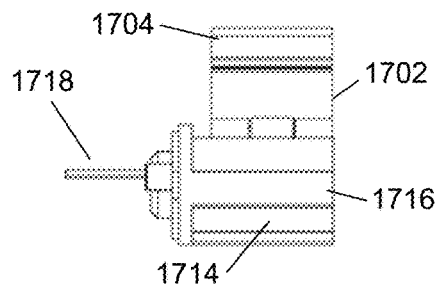
Figure 17F:
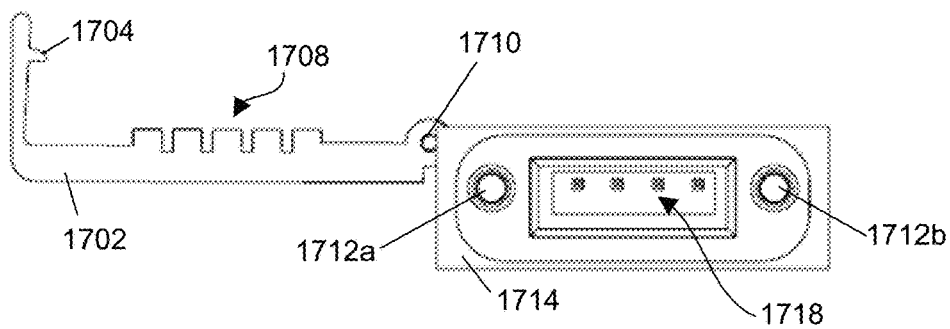
Figure 18A:
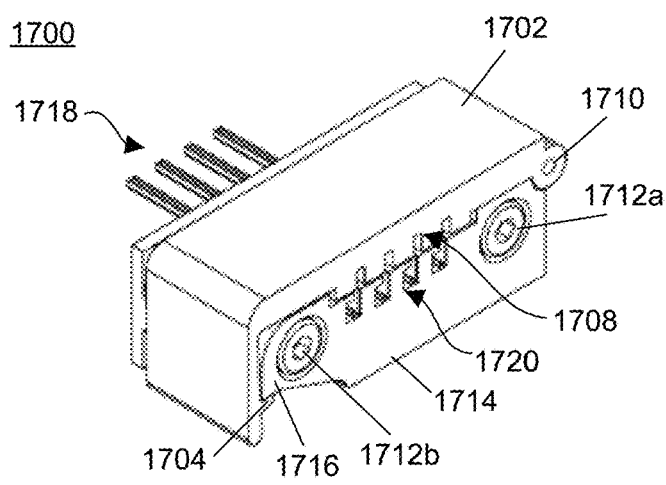
Figure 18C:
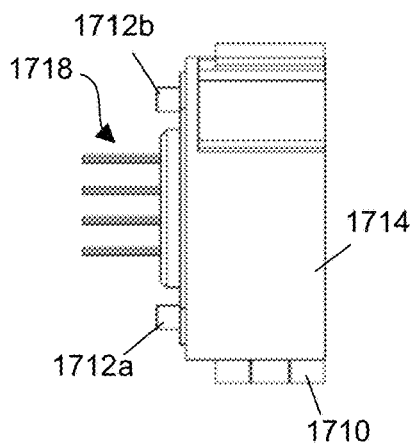
Figure 18B:
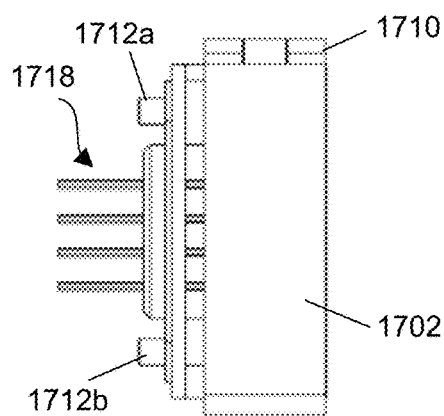
Figure 18D:
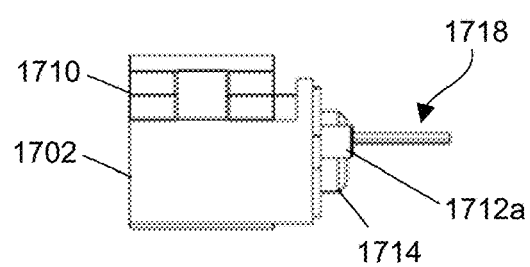
Figure 18E:
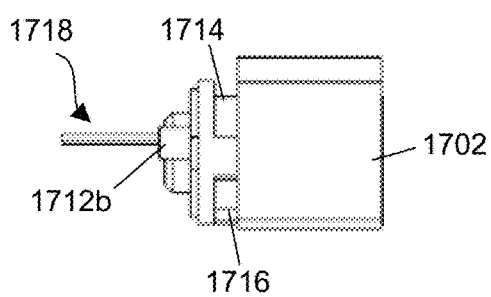
Figure 18F:
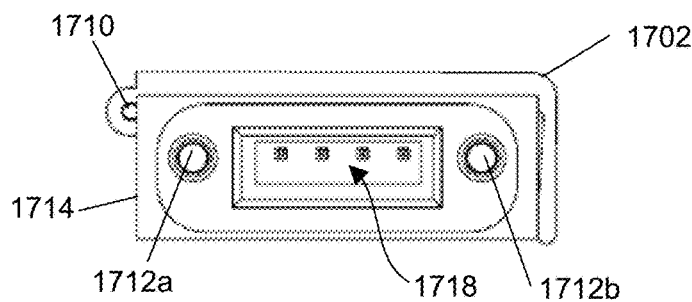
Figure 19A:
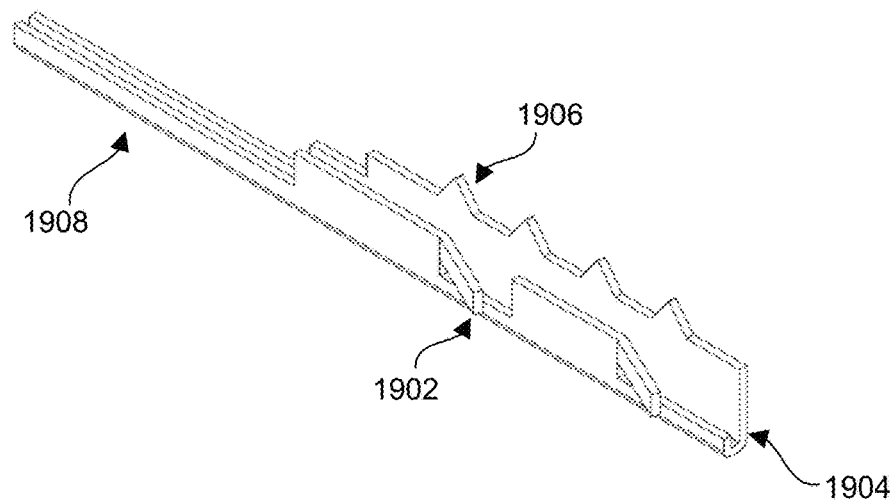
Figure 19B:
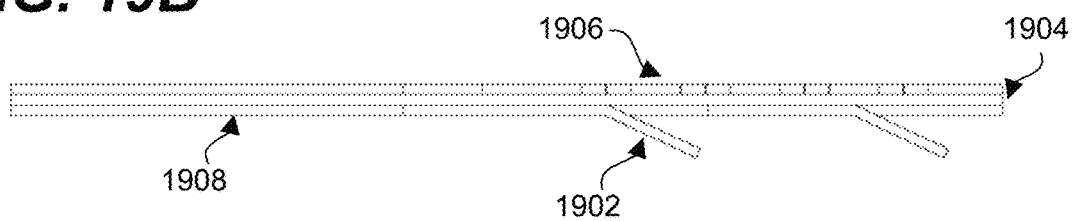
Figure 19C:
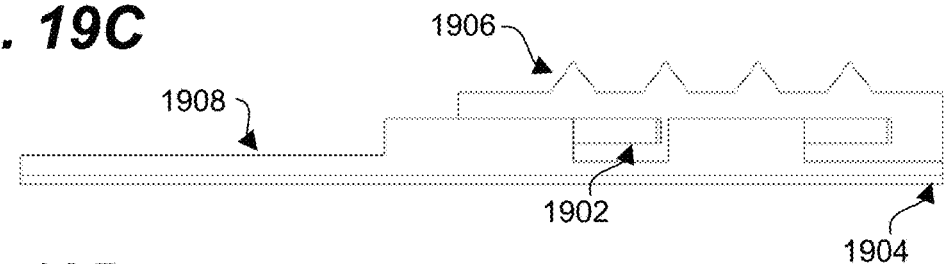
Figure 19D:
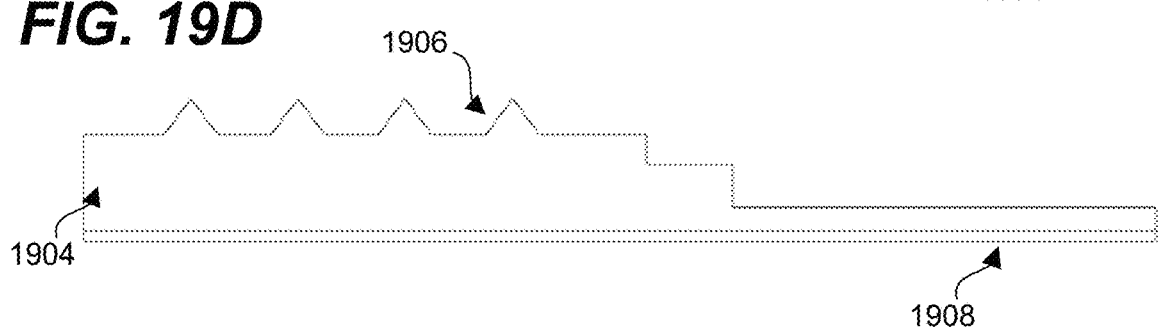
Figure 19E:
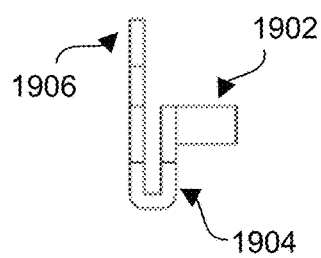

FIGS. 16A-16D are isometric, top, side, and front views of a flat flexible cable and connector assemblies 1600. As shown in FIGS. 16A-16D, a flat flexible fluid sensing cable might include a first length of flat cable 1604a and a second length of flat cable 1604b, which may be joined by an optional cable extension connector 1606. Each of the first length of cable 1604a and second length of cable 1604b may be implemented as the various embodiments of cable 102 described herein. For example, the illustrative cable lengths 1604a and 1604b may have four conductors 1608a-d disposed on substrate 1620, although, as described herein, other numbers of conductors may be employed. As shown, cable length 1604a may have one end terminated with a preformed connector 1616 that terminates cable 1604a with a male stereo jack connector 1602 (e.g., a male 3.5 mm stereo jack). As shown in FIG. 16B, male stereo jack 1602 may have one or more conductive contacts, shown as contacts 1602a-d, which may be coupled to corresponding ones of conductors 1608a-d.

In some embodiments, cable extension connector 1606 may be a crimp-connector having a plurality of barbs 1624 to pierce substrate 1620 (and/or the fluid-permeable cover layer, which is not shown in FIGS. 16A-16D) when top clasps 1610a and 1610b are closed over cable lengths 1604a and 1604b, respectively. As shown, cable extension connector 1606 may have a first crimp side to crimp a first cable (e.g., cable length 1604a) and a second crimp side to crimp a second cable (e.g., cable length 1604b). As shown, each crimp side may have a respective top clasp 1610a, 1610b that interact with respective latches 1622a and 1622b of connector body 1623, such that the top clasps lock in a closed position over the respective cables.

Each crimp side may have a respective set of barbs 1624a, 1624b to pierce substrate 1620 (and/or the fluid-permeable cover layer, which is not shown in FIGS. 16A-16D) when top clasps 1610a and 1610b are closed over cable lengths 1604a and 1604b, respectively. In general, each conductor 1608a-d may have a corresponding set of barbs 1624. Each of top clasps 1610a, 1610b may have corresponding cable wedges 1618a, 1618b to firmly press cable lengths 1604a and 1604b onto barbs 1624a, 1624b to ensure that the substrate and/or fluid-permeable cover are penetrated by the barbs and an electrical connection is made between the barbs 1624 and the corresponding conductor 1608 of each cable length 1604a, 1604b.

In other embodiments, cable length 1604a may be a preformed length of cable 102 that is terminated with a preformed cable extension connector, where the preformed cable extension connector is a female 3.5 mm stereo jack connector. Similarly, cable length 1604b may be a preformed length of cable 102 that is terminated on one end with a male stereo jack (e.g., connector 1616 and jack 1602) that can be coupled to the female stereo jack connector of cable length 1604. Similarly, cable length 1604b may be terminated at its other end with a female stereo jack, thereby enabling users to use preformed cable lengths to adjust the length of the cable to a desired longer length. In yet other embodiments, the male and female stereo jack connectors may be implemented having a crimp connector such as described in regard to FIGS. 16-18, such that users can create custom lengths of cable but still employ stereo jack terminations. In yet other embodiments, a cable segment may be terminated by either a preformed or crimp jumper connector (not shown). The jumper connector may couple two or more of conductors 1608a-d together, which may enable other functionality of cable 102, for example to detect a broken or damaged cable, or to communicate electrical signals between two or more devices coupled to the cable.

FIGS. 17A-17F are isometric, top, bottom, left, right, and front views of a flat cable crimp connector assembly in an open configuration, and FIGS. 18A-18F are isometric, top, bottom, left, right, and front views of the flat cable crimp connector assembly in a closed configuration. As shown in the various FIG. 17 and FIG. 18, crimp connector 1700 may have a top clasp 1702 connected to bottom body 1714 via hinge assembly 1710. Top clasp 1702 includes latch 1704, which interacts with latch catch 1716 on bottom body 1714. When top clasp 1702 is closed, latch catch 1716 may engage latch 1704 such that top clasp 1702 stays closed and cable wedge 1708 of top clasp 1702 firmly presses a cable (not shown) against teeth 1722 of cable barbs 1720.

Each of cable barbs 1720 may correspond to a given one of the conductors in the cable to be crimped. When top clasp 1702 is latched in place (e.g., when latch catch 1716 engages latch 1704), teeth 1722 of cable barbs 1720 may pierce the substrate and/or the fluid-permeable cover of cable 102, thereby establishing an electrical connection with the conductors of cable 102. Thus, an electrical connection between corresponding ones of the conductors and corresponding ones of the cable barbs is ensured by the firm connection between top clasp 1702 and bottom body 1714. Each of cable barbs 1720 may be coupled to (or be a contiguous part of) connector pins 1718, thereby allowing the cable conductors to be electrically coupled to a receptable that receives connector pins 1718, for example conductive fluid sensing system 100. In some embodiments, bottom body 1714 may include one or more mounting screws 1712a, 1712b, for firmly mounting crimp connector 1700 to conductive fluid sensing system 100 or some other bulkhead or receptacle.

FIGS. 19A-19E are isometric, top, right, left, and front views of the connector pin and cable barb assemblies of the flat cable connector assembly of FIGS. 17A-17F and FIGS. 18A-18F. As shown in FIGS. 19A-19E, each connector pin and cable barb assembly 1900 may have a corresponding pin portion 1908 and barb portion 1904, having teeth 1906 and mounting arms 1902 to keep assembly 1900 firmly in place within bottom body 1714.

Described embodiments provide a flat conductive fluid sensor cable a flat conductive fluid sensor cable capable of manufacture in long lengths. The flat conductive fluid sensor cable includes a flexible substrate, two or more flat conductors, and a fluid-permeable material. The fluid-permeable material allows a conductive fluid to form an electrically conductive path between the two or more conductors when conductive fluid contacts the conductive fluid sensor cable. For example, some embodiments include a substrate having an adhesive surface and extending in an extension direction. The fluid-permeable material is disposed over the substrate adhesive surface. First and second uninsulated flat conductors are each laterally positioned and electrically isolated from one another and positioned in a layer between the substrate and the fluid-permeable material. The first and second conductors each extend along the adhesive surface of the substrate in the extension direction. The substrate, first and second conductors, and fluid-permeable material are adhered together to form a laminated structure of the conductive fluid sensor cable. The laminated structure seals the first and second conductors between the substrate and the fluid-permeable material. The fluid-permeable material directly covers and contacts the first and second conductors. In the presence of conductive fluid, the fluid-permeable material permits conductive fluid to contact the first and second conductors and form a conductive path between the first and second conductors. An attached sensor detects the conductive path, which indicates the presence of the conductive fluid, and may generate a signal responsive to detecting the presence of the conductive fluid.

Although embodiments have been described for illustrative purposes, those skilled in the art will appreciate that various modifications, additions and substitutions are possible, without departing from the scope and spirit of the accompanying claims. For example, reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. For purposes of this description, the terms "couple," "coupling," "coupled," "connect," "connecting," or "connected" refer to any manner known in the art or later developed in which energy is allowed to be transferred between two or more elements, and the interposition of one or more additional elements may be contemplated, although not required.

To the extent directional terms are used in the specification and claims (e.g., upper, lower, parallel, perpendicular, etc.), these terms are merely intended to assist in describing the embodiments and are not intended to limit the claims in any way. Such terms do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

It will be further understood that various changes in the details, materials, and arrangements of the parts that have been described and illustrated herein might be made by those skilled in the art without departing from the scope of the following claims.

We claim:

1. A flat flexible cable (FFC) for sensing conductive fluids, the FFC comprising:
    a substrate having a B-stage adhesive surface extending in an extension direction;
    first and second uninsulated flat conductors, each laterally positioned and each extending in the extension direction, and each electrically isolated from one another in the absence of conductive fluid, wherein each of the first and second uninsulated flat conductors is laminated directly to the substrate solely by way of the B-stage adhesive surface; wherein each of the first and second uninsulated flat conductors comprise a first surface and an opposite-facing second surface;
    a fluid-permeable cover layer comprising a plurality of microdots disposed on the adhesive layer of the substrate and the respective second surfaces of the first and second uninsulated flat conductors, wherein the plurality of microdots form voids therebetween; the fluid-permeable cover layer laminated directly to the substrate solely by way of the B-stage adhesive surface, the fluid-permeable cover layer overlaying and directly contacting the conductors thereby sealing the conductors in fixed position between the substrate and the fluid-permeable cover layer, wherein a conductive path between the first and second uninsulated flat conductors is formed in the presence of a conductive fluid.

2. The FFC of claim 1, wherein the substrate comprises a polyimide substrate.

3. The FFC of claim 1, wherein the substrate comprises a polyester substrate.

4. The FFC of claim 1, wherein the substrate, first and second uninsulated flat conductors, and fluid-permeable cover layer are adhered together solely by the B-stage adhesive surface, thereby forming a laminated structure of the FFC, the laminated structure configured to seal the first and second uninsulated flat conductors between the substrate and the fluid-permeable cover layer, wherein the fluid-permeable cover layer directly covers and contacts the first and second uninsulated flat conductors and, in the presence of conductive fluid, permits conductive fluid to penetrate the fluid-permeable cover layer and contact the first and second conductors, and form a conductive path between the first and second uninsulated flat conductors.

5. The FFC of claim 4, wherein the laminated structure is characterized by a total thickness of less than 0.2 mm.

6. The FFC of claim 1, wherein the first and second uninsulated flat conductors comprise at least one in the group consisting of flat conductive foil tape, flat conductive foil, printed conductive ink, flat wire, and conductive traces.

7. The FFC of claim 1, wherein the fluid-permeable cover layer is disposed upon and directly contacts the respective second surfaces of the first and second uninsulated flat conductors, and wherein the respective first surfaces of the first and second uninsulated flat conductors directly contact the B-stage adhesive surface.

8. The FFC of claim 1, wherein the FFC is coupled to a sensor system, the sensor system configured to detect the conductive path and generate a fluid status signal in response thereto.

9. The FFC of claim 8, wherein the FFC is coupled to the sensor system by a crimp connector at one end of the FFC, the crimp connector comprising:
a top clasp hingably mounted to a bottom body having a plurality of barbs mounted therein, each of the plurality of barbs corresponding to a given one of the first and second uninsulated flat conductors, and each of the plurality of barbs coupled to a corresponding one of a plurality of pins, the pins configured to be received in a connector of the sensor system, wherein the crimp connector is configured to make an electrical connection between each of the plurality of barbs and the corresponding one of the first and second uninsulated flat conductors when the top clasp is closed such that a wedge of the top clasp presses the corresponding one of the first and second uninsulated flat conductors against the corresponding barbs.

10. The FFC of claim 8, wherein the FFC is coupled to the sensor system by a male stereo jack connector at one end of the FFC, the male stereo jack connector having a plurality of conductive segments of the jack, each of the plurality of conductive segments of the jack corresponding to a given one of the first and second uninsulated flat conductors.

11. The FFC of claim 10, further comprising a female stereo connector at an opposite end of the FFC, the female stereo connector configured to receive a male stereo jack connector of a subsequent FFC, thereby extending a length of the FFC.

12. The FFC of claim 8, further comprising a crimp connector having a first top clasp hingably mounted to a bottom body and a second top clasp hingably mounted to the bottom body, the bottom body having a plurality of barbs mounted therein, each of the plurality of barbs corresponding to a given one of the first and second uninsulated flat conductors of a first and a second segment of the FFC, wherein the crimp connector is configured to make an electrical connection between each of the plurality of barbs and the corresponding one of the first and second uninsulated flat conductors of the first segment of the FFC when the first top clasp is closed such that a wedge of the top clasp presses each of the first and second conductors against the corresponding barbs, and wherein the crimp connector is configured to make an electrical connection between each of the plurality of barbs and the corresponding one of the first and second uninsulated flat conductors of the second segment of the FFC when the second top clasp is closed such that a wedge of the top clasp presses each of the first and second conductors against the corresponding barbs.

13. The FFC of claim 1, further comprising:
a third uninsulated flat conductor, the third uninsulated flat conductor laterally positioned to the first and second uninsulated flat conductors, extending in the extension direction, and laminated directly to the substrate solely by way of the B-stage adhesive surface; and
a jumper conductor configured to electrically connect the third conductor to a first one of the first conductor and the second conductor, such that the third conductor is electrically coupled to the first one of the first conductor and the second conductor, and electrically isolated from another of the first conductor and the second conductor, wherein the jumper conductor is configured to complete a circuit between the third conductor and the first one of the first conductor and the second conductor.

14. The FFC of claim 13, wherein the FFC is coupled to a sensor system, the sensor system configured to detect the completed circuit between the third conductor and the other of the first conductor and the second conductor, and generate a cable status signal in response thereto.

15. A fluid sensing system configured to detect the presence of a fluid, the system comprising:
a flat flexible cable (FFC) comprising:
a substrate having a B-stage adhesive surface extending in an extension direction;
first and second uninsulated flat conductors, each laterally positioned and each extending in the extension direction, and each electrically isolated from one another in the absence of conductive fluid, wherein each of the first and second uninsulated flat conductors is laminated directly to the substrate solely by way of the B-stage adhesive surface; wherein each of the first and second uninsulated flat conductors comprise a first surface and an opposite-facing second surface;
a fluid-permeable cover layer laminated directly to the substrate solely by way of the B-stage adhesive surface, the fluid-permeable cover layer overlaying and directly contacting the conductors thereby sealing the conductors in fixed position between the substrate and the fluid-permeable cover layer, wherein a conductive path between the first and second uninsulated flat conductors is formed in the presence of a conductive fluid, wherein the fluid-permeable cover layer comprises a plurality of microdots disposed on the B-stage adhesive surface of the substrate and the respective second surfaces of the first and second uninsulated flat conductors; wherein the plurality of microdots form voids therebetween; and
a sensor coupled to the FFC, the sensor comprising:
a processor configured to receive an electrical signal indicative of the formed conductive path and generate a fluid detection signal in response thereto, the fluid detection signal transmitted to one or more remote devices.

16. The fluid sensing system of claim 15, wherein the FFC further comprises:
a third uninsulated flat conductor, the third uninsulated flat conductor laterally positioned to the first and second uninsulated flat conductors, extending in the extension direction, and laminated directly to the substrate solely by way of the B-stage adhesive surface; and
a jumper conductor configured to electrically connect the third conductor to a first one of the first conductor and the second conductor, such that the third conductor is electrically coupled to the first one of the first conductor and the second conductor, and electrically isolated from another of the first conductor and the second conductor, wherein the jumper conductor is configured to complete a circuit between the third conductor and the first one of the first conductor and the second conductor.

17. The fluid sensing system of claim 16, wherein the processor is configured to detect the completed circuit between the third conductor and the first one of the first conductor and the second conductor, and generate a cable status signal in response thereto, the cable status signal transmitted to one or more remote devices.

18. The fluid sensing system of claim 15, wherein the substrate comprises a polyimide substrate.

19. The fluid sensing system of claim 15, wherein the substrate comprises a polyester substrate.

20. The fluid sensing system of claim 15, wherein the substrate, first and second uninsulated flat conductors, and fluid-permeable cover layer are adhered together solely by the B-stage adhesive surface, thereby forming a laminated structure of the FFC, the laminated structure configured to seal the first and second uninsulated flat conductors between the substrate and the fluid-permeable cover layer, wherein the fluid-permeable cover layer directly covers and contacts the first and second uninsulated flat conductors and, in the presence of conductive fluid, permits conductive fluid to penetrate the fluid-permeable cover layer and contact the first and second conductors, and form a conductive path between the first and second uninsulated flat conductors.

21. The fluid sensing system of claim 20, wherein the laminated structure is characterized by a total thickness of less than 0.2 mm.

22. The fluid sensing system of claim 15, wherein the first and second uninsulated flat conductors comprise at least one in the group consisting of flat conductive foil tape, flat conductive foil, printed conductive ink, flat wire, and conductive traces.

23. The fluid sensing system of claim 15, wherein the fluid-permeable cover layer directly covers and directly contacts the respective second surfaces of the first and second uninsulated flat conductors, and wherein the respective first surfaces of the first and second uninsulated flat conductors directly contact the B-stage adhesive surface.

24. The fluid sensing system of claim 15, wherein the FFC is coupled to the sensor by a crimp connector at one end of the FFC, the crimp connector comprising: a top clasp hingably mounted to a bottom body having a plurality of barbs mounted therein, each of the plurality of barbs corresponding to a given one of the first and second uninsulated flat conductors, and each of the plurality of barbs coupled to a corresponding one of a plurality of pins, the pins configured to be received in a connector of the sensor system, wherein the crimp connector is configured to make an electrical connection between each of the plurality of barbs and the corresponding one of the first and second uninsulated flat conductors when the top clasp is closed such that a wedge of the top clasp presses the corresponding one of the first and second uninsulated flat conductors against the corresponding barbs.

25. The fluid sensing system of claim 15, wherein the conductive fluid cable is coupled to the sensor by a male stereo jack connector at one end of the FFC, the male stereo jack connector having a plurality of conductive segments of the jack, each of the plurality of conductive segments of the jack corresponding to a given one of the first and second uninsulated flat conductors.

26. The fluid sensing system of claim 25, further comprising a female stereo connector at an opposite end of the FFC, the female stereo connector configured to receive a male stereo jack connector of a subsequent FFC, thereby extending a length of the FFC.

27. The fluid sensing system of claim 15, further comprising a crimp connector having a first top clasp hingably mounted to a bottom body and a second top clasp hingably mounted to the bottom body, the bottom body having a plurality of barbs mounted therein, each of the plurality of barbs corresponding to a given one of the first and second uninsulated flat conductors of a first and a second segment of the FFC, wherein the crimp connector is configured to make an electrical connection between each of the plurality of barbs and the corresponding one of the first and second uninsulated flat conductors of the first segment of the FFC when the first top clasp is closed such that a wedge of the top clasp presses each of the first and second conductors against the corresponding barbs, and wherein the crimp connector is configured to make an electrical connection between each of the plurality of barbs and the corresponding one of the first and second uninsulated flat conductors of the second segment of the FFC when the second top clasp is closed such that a wedge of the top clasp presses each of the first and second conductors against the corresponding barbs.

* * * * *